US008883399B2

(12) United States Patent
Iso

(10) Patent No.: US 8,883,399 B2
(45) Date of Patent: Nov. 11, 2014

(54) ABLATION LAYER, PHOTOSENSITIVE RESIN STRUCTURE, AND METHOD FOR PRODUCING RELIEF PRINTING PLATE USING THE PHOTOSENSITIVE RESIN STRUCTURE

(75) Inventor: Chisato Iso, Tokyo (JP)

(73) Assignee: Asahi Kasei E-Materials Corporation, Tokyo (JP)

( * ) Notice: Subject to any disclaimer, the term of this patent is extended or adjusted under 35 U.S.C. 154(b) by 0 days.

(21) Appl. No.: 13/133,289

(22) PCT Filed: Dec. 18, 2009

(86) PCT No.: PCT/JP2009/007000
§ 371 (c)(1),
(2), (4) Date: Jul. 28, 2011

(87) PCT Pub. No.: WO2010/070918
PCT Pub. Date: Jun. 4, 2010

(65) Prior Publication Data
US 2011/0275016 A1 Nov. 10, 2011

(30) Foreign Application Priority Data

Dec. 18, 2008 (JP) ................................ 2008-321945
Nov. 18, 2009 (JP) ................................ 2009-263241

(51) Int. Cl.
*C08F 20/06* (2006.01)
*G03C 1/00* (2006.01)
*G03F 7/00* (2006.01)
*G03F 7/26* (2006.01)
*G03F 7/20* (2006.01)
*G03F 1/00* (2012.01)

(52) U.S. Cl.
CPC ............... *G03F 7/202* (2013.01); *G03F 1/003* (2013.01); *G03F 7/2022* (2013.01)
USPC ..................... 430/273.1; 430/270.1; 430/306; 430/401; 430/405; 526/318.6

(58) Field of Classification Search
CPC .............. G03F 1/00; G03F 3/00; G03F 7/00; B41N 1/00
USPC ............................. 430/270.1, 306; 101/463.1
See application file for complete search history.

(56) References Cited

U.S. PATENT DOCUMENTS

| 3,966,472 | A | * | 6/1976 | Kubotera et al. ............. 430/264 |
| 4,275,142 | A | | 6/1981 | Hosaka et al. |
| 5,177,171 | A | | 1/1993 | Usubuchi et al. |
| 5,262,275 | A | * | 11/1993 | Fan ............................ 430/273.1 |
| 5,679,485 | A | | 10/1997 | Suzuki et al. |
| 5,705,310 | A | * | 1/1998 | Van Zoeren ................. 430/201 |
| 5,736,298 | A | | 4/1998 | Koshimura et al. |
| 5,843,622 | A | | 12/1998 | Tomita et al. |
| 5,863,704 | A | | 1/1999 | Sakurai et al. |
| 6,238,837 | B1 | | 5/2001 | Fan |
| 6,284,431 | B1 | | 9/2001 | Tanizaki et al. |
| 6,673,509 | B1 | | 1/2004 | Metzger |
| 6,897,006 | B2 | | 5/2005 | Fujimoto et al. |
| 2001/0005569 | A1 | | 6/2001 | Nanpei et al. |
| 2001/0053498 | A1 | | 12/2001 | Fujimoto et al. |
| 2002/0115019 | A1 | | 8/2002 | Kaczun et al. |
| 2003/0036017 | A1 | | 2/2003 | Tanizaki et al. |
| 2004/0197706 | A1 | * | 10/2004 | Wada et al. ................. 430/273.1 |
| 2006/0008729 | A1 | | 1/2006 | Ichikawa et al. |
| 2006/0257788 | A1 | | 11/2006 | Matsumoto et al. |
| 2007/0014953 | A1 | * | 1/2007 | Siegel et al. ................. 428/35.7 |
| 2008/0171289 | A1 | * | 7/2008 | Maehashi ................. 430/286.1 |
| 2010/0167202 | A1 | | 7/2010 | Yoshimoto et al. |
| 2011/0023739 | A1 | | 2/2011 | Yoshimoto et al. |

FOREIGN PATENT DOCUMENTS

| EP | 0 183 552 | 6/1986 |
| EP | 0 598124 | 5/1994 |
| EP | 0741329 | 11/1996 |
| EP | 0741330 | 11/1996 |
| EP | 1156368 | 11/2001 |
| EP | 1156368 A2 * | 11/2001 |
| EP | 1593523 | 11/2005 |
| EP | 1629975 | 3/2006 |
| EP | 2287672 | 2/2011 |
| JP | 58-33884 | 2/1983 |
| JP | 59-29849 | 7/1984 |
| JP | 60-211451 | 10/1985 |
| JP | 61-128243 | 6/1986 |
| JP | 3-206456 | 9/1991 |
| JP | 5-7705 | 1/1993 |
| JP | 6-194837 | 7/1994 |
| JP | 7-134411 | 5/1995 |
| JP | 9-15860 | 1/1997 |
| JP | 10-509254 | 9/1998 |
| JP | 2916408 | 4/1999 |
| JP | 11-153865 | 6/1999 |
| JP | 2940006 | 6/1999 |
| JP | 2985655 | 10/1999 |
| JP | 2000-56447 | 2/2000 |
| JP | 2001-56564 | 2/2001 |

(Continued)

OTHER PUBLICATIONS

International Preliminary Report on Patentability for PCT/JP2009/007000, mailed Jul. 5, 2011.
International Search Report for PCT/JP2009/00700.
Search report from E.P.O. that issued with respect to patent family member European Patent Application No. 09833225 7, mail date is Sep. 30, 2011.

*Primary Examiner* — Chanceity Robinson
(74) *Attorney, Agent, or Firm* — Greenblum & bernstein, P.L.C.

(57) ABSTRACT

A photosensitive resin structure having an ablation layer for a photosensitive resin for a relief printing that is capable of being processed by infrared radiation and containing an anionic polymer, a relief printing plate is produced by drawing a pattern by irradiating the ablation layer with infrared radiation; exposing the pattern by irradiating the photosensitive resin layer with ultraviolet radiation; and removing the ablation layer and unexposed photosensitive resin layer with a developer.

4 Claims, No Drawings

(56) References Cited

FOREIGN PATENT DOCUMENTS

| JP | 2001-264959 | 9/2001 |
| JP | 2001-324815 | 11/2001 |
| JP | 2002-162731 | 6/2002 |
| JP | 2002-214792 | 7/2002 |
| JP | 3508788 | 1/2004 |
| JP | 2004-163925 | 6/2004 |
| JP | 3830959 | 7/2006 |
| JP | 4200510 | 10/2008 |
| JP | 4332865 | 7/2009 |
| WO | 96/16356 | 5/1996 |
| WO | 2009/150703 | 12/2009 |

* cited by examiner

ABLATION LAYER, PHOTOSENSITIVE RESIN STRUCTURE, AND METHOD FOR PRODUCING RELIEF PRINTING PLATE USING THE PHOTOSENSITIVE RESIN STRUCTURE

TECHNICAL FIELD

The present invention relates to an ablation layer that constitutes a photosensitive resin structure for a relief printing, a photosensitive resin structure comprising the ablation layer, and a method for producing a relief printing plate using the photosensitive resin structure.

BACKGROUND ART

Rubber plates have heretofore been used for a flexographic printing; in recent years, however, various photosensitive resin structures for the flexographic printing that use thermoplastic elastomers as base polymers have been proposed instead of rubber plates.

Solution developable-types, solvent developable-types, and water or aqueous developable-types of photosensitive elastomer compositions are known as materials forming these photosensitive resin structures for the flexographic printing, and various photosensitive elastomer compositions have been proposed (see, for example, Patent document 1).

With respect to technologies for the production of these photosensitive resin structures for the flexographic printing, the CTP (Computer To Plate) technology in the flexographic platemaking has been developed.

The CTP technology for flexography involves, for example, providing a layer that is ablatable by infrared radiation on a photosensitive resin composition layer, and removing the ablation layer that corresponds to a desired image by laser radiation, thereby forming a portion that transmits active light, i.e., a negative.

As such an ablation layer, a material layer that incorporates an infrared absorbing material in a predetermined binder (see, for example, Patent document 2), and a thin layer made of a metal having infrared absorption properties (see, for example, Patent document 3) are known.

Specific examples of proposed photosensitive resin structures comprising infrared ablation layers are as follows.

For example, flexographic printing plates wherein an infrared ablation layer, a barrier layer, and a photosensitive resin composition layer are laminated in sequence have been proposed (see, for example, Patent document 4).

Moreover, as water developable-types of photosensitive resin structures for the flexographic printing, those using water-insoluble polyamides or the like as infrared ablation layers have been proposed (see, for example, Patent document 5).

Furthermore, ablation layers containing polyvinyl alcohols have also been proposed (see, for example, Patent document 6).

PRIOR ART DOCUMENTS

Patent Document

Patent document 1: Japanese Patent Application Publication No. 59-29849
Patent document 2: Japanese Patent Laid-Open No. 11-153865
Patent document 3: Japanese Patent Laid-Open No. 2004-163925
Patent document 4: National Publication of International Patent Application No. 1998-509254
Patent document 5: Japanese Patent No. 2916408
Patent document 6: Japanese Patent Laid-Open No. 2000-56447

SUMMARY OF INVENTION

Problems to be Solved by the Invention

However, the heretofore proposed photosensitive resin structures comprising infrared ablation layers have the following drawbacks.

The photosensitive resin structure disclosed in Patent document 4 has a barrier layer, which increases the production steps for a printing plate, making the production complicated. Moreover, depending on the material of the barrier layer, the interface between the barrier layer and infrared ablation layer may be peeled off. Furthermore, because the barrier layer is not ablated, oxygen permeability becomes poor, resulting in problems such as blurring of the formed image.

The problem of image blurring is attributed to the fact that the curing mechanism of the photosensitive resin structure for the flexographic printing occurs through radical polymerization.

Because radicals produced during polymerization are deactivated by oxygen, curing tends to proceed slowly near the plate surface that is in contact with air. For this reason, in CTP plates that do not require intimate adhesion of negatives or the like, and whose outermost surface is in contact with air, curing of detail portions is suppressed, as compared to analog plates that require negatives. Utilizing this curing suppression effect due to oxygen inhibition, CTP plates enable the formation of images finer than the images formed using analog plates.

On the other hand, the presence of a barrier layer suppresses the contact between the resin and oxygen, preventing the deactivation of radicals, thus causing the curing to proceed smoothly, resulting in the inability to obtain the curing suppression effect due to oxygen. This rather degrades the definition of an image, resulting in the so-called blurring of the formed image.

The technique described in Patent document 5 has practical problems in that the accumulation of undissolved matter in an aqueous developer contaminates the developer, making it inevitable to increase the frequency of replacing the developer.

The accumulation of ablation layer residue in an aqueous developer also causes problems such as re-adhesion of the residue to the photosensitive resin composition layer, and clogging in the developing apparatus.

Furthermore, the adhesion between the photosensitive resin composition layer and ablation layer is not sufficient, leading to problems such as peeling off of the ablation layer during work.

The technique described in Patent document 6 has problems in that, as with the protective film of an analog plate, rapid absorption of moisture occurs after peeling off the cover film that is laminated to the ablation layer, thereby causing wrinkles in the ablation layer, and making its surface uneven. This makes adjustment of the laser focus difficult, degrading the sharpness of the image to be drawn, resulting in lower plate quality.

Thus, an object of the present invention is to provide an ablation layer for a photosensitive resin wherein the ablation layer has practically sufficient adhesion between the photosensitive resin composition layer and ablation layer, and wherein (1) the ablation layer is not wrinkled by moisture absorption in a high-humidity environment even after peeling off the cover film attached thereto, (2) the portion that has been removed with a developer can easily dissolve and disperse in the developer, thereby effectively preventing washing residue from remaining, and (3) the ablation layer is capable of being processed by infrared radiation; a photosensitive resin structure comprising the ablation layer; and a method for producing a relief printing plate using the photosensitive resin structure.

Means for Solving the Problems

As a result of extensive research to solve the prior art problems described above, it was found that the above-described object can be achieved by an ablation layer for a photosensitive resin for a relief printing plate that is capable of being processed by a infrared radiation, and contains an anionic polymer, and a photosensitive resin structure comprising the ablation layer. Consequently, the present invention was accomplished.

In summary, the present invention is as described below.

[1]
An ablation layer for a photosensitive resin for a relief printing, the ablation layer capable of being processed by infrared radiation, and comprising an anionic polymer.

[2]
The ablation layer according to item [1] above, further comprising a polymer having an ester bond in a side chain and having a saponification degree of 0% or more and 90% or less.

[3]
The ablation layer according to item [1] or [2] above, wherein the ablation layer is capable of being removed with an aqueous developer.

[4]
The ablation layer according to item [1] or [2] above, wherein the ablation layer is capable of being removed with a solvent-based developer.

[5]
The ablation layer according to any one of items [1] to [4] above, comprising a carbon black as an infrared absorbent.

[6]
A photosensitive resin structure for a relief printing comprising:
a support;
a photosensitive resin layer provided on the support; and
the ablation layer according to any one of items [1] to [5] above provided on the photosensitive resin layer.

[7]
A method for producing a relief printing plate comprising the steps of:
irradiating a photosensitive resin structure for a relief printing comprising a support, a photosensitive resin layer provided on the support, and the ablation layer according to any one of items [1] to [5] above provided on the photosensitive resin layer, with an ultraviolet radiation from a support side of the photosensitive resin structure;
drawing a pattern by irradiating the ablation layer with an infrared radiation;
exposing the pattern by irradiating the photosensitive resin layer with an ultraviolet radiation; and
removing the ablation layer and unexposed photosensitive resin layer with a developer.

Advantageous Effects of Invention

In accordance with the present invention, there can be provided an ablation layer that is not wrinkled by moisture absorption in a high-humidity environment even after peeling off the cover film attached thereto wherein the portion that has been removed with a developer can easily dissolve and disperse in the developer, thereby effectively preventing washing residue from remaining or being re-adhered and that is capable of being processed by a infrared radiation; a photosensitive resin structure comprising the ablation layer; and a method for producing a relief printing plate using the photosensitive resin structure.

MODE FOR CARRYING OUT THE INVENTION

An embodiment of the present invention (hereinafter referred to as "present embodiment") will be described in detail below.

It is noted that the present invention is not limited to the following description, and can be practiced by making various modifications thereto within the gist of the present invention.

[Ablation Layer]

The ablation layer of the present embodiment is an ablation layer that constitutes the below-described photosensitive resin structure for the making of a relief printing plate, is capable of being processed (drawn) by infrared radiation, and contains an anionic polymer.

In the below-described photosensitive resin structure for the making of a relief printing plate, the ablation layer is laminated to the photosensitive resin composition layer, optionally with a predetermined protective layer therebetween.

The ablation layer is typically covered with a predetermined cover film on a surface opposite the surface in contact with the photosensitive resin composition layer, thereby being protected from open air or damage.

Infrared processing (drawing) is performed after peeling off the cover film; at this time, in order to prevent wrinkling due to moisture absorption, and achieve good cleanliness in the subsequent development step, the ablation layer of the present embodiment contains an anionic polymer.

When the ablation layer contains the anionic polymer, the problems of wrinkling due to moisture absorption and cleanliness that have heretofore been present can be solved; moreover, in the development step, re-adhesion of ablation layer residue to the plate surface can be avoided.

Furthermore, in order to increase the adhesion of the ablation layer to the photosensitive resin composition layer or protective layer, the ablation layer of the present embodiment preferably contains a polymer having a saponification degree of not more than 90%, and having an ester bond in a side chain.

To produce a relief printing plate, after the ablation layer that constitutes the photosensitive resin structure is drawn by infrared radiation, a pattern is formed on the photosensitive resin composition layer.

The pattern formation on the photosensitive resin composition layer is typically performed by way of exposure, development, and post-exposure steps.

Generally, a photosensitive resin structure wherein an adhesive layer, a photosensitive resin composition layer, an ablation layer, and a cover film (for example, a PET film) are laminated in sequence to a support having dimensional stability (a base film; for example, a polyethylene terephthalate (PET) film) is subjected to each of the above-mentioned steps to prepare a relief printing plate.

The ablation layer of the present embodiment contains an anionic polymer, and thereby has excellent wrinkling resistance, can be homogeneously dissolved and dispersed in a developer in the development treatment step, and exhibits excellent cleanliness.

The term "anionic polymer" herein refers to polymers having anionic polar functional groups.

In particular, resins that are insoluble in neutral water, or resins whose moisture absorption is not more than 20%, are preferred.

The number average molecular weight of the anionic polymer is preferably from 3,000 to 100,000, more preferably from 5,000 to 80,000, and still more preferably from 5,000 to 30,000, although not particularly limited thereto.

The number average molecular weight of the anionic polymer can be determined by measurement based on polystyrene standards, using gel permeation chromatography (GPC).

Examples of the anionic polymers may include acrylic resins, styrene resins, vinyl chloride resins, vinylidene chloride resins, polyolefin resins, polyamide resins, polyacetal resins, polycarbonate resins, polyester resins, polyphenylene sulfide resins, polysulfone resins, polyether ketone resins, polyimide resins, fluororesins, silicone resins, urethane resins, urea resins, melamine resins, guanamine resins, epoxy resins, and phenolic resins; and copolymers of these resins.

These polymers can be used alone or in a combination of two types or more.

Examples of the anionic polar functional groups of the anionic polymer may include phosphoric acid groups, sulfonic acid groups, carboxylic acid groups, and phenolic hydroxyl groups. In view of the ease of handling and availability, carboxylic acid groups, sulfonic acid groups, and phenolic hydroxyl groups are preferred. Moreover, in view of suppressing wrinkling due to moisture absorption, and resin adhesion, sulfonic acid groups are preferred.

In the present embodiment, hydroxyl groups are not included in the anionic polar functional groups.

The amount of the anionic polar functional groups in the anionic polymer is preferably 1 mass % or more in view of ensuring good cleanliness, and is preferably 80 mass % or less in view of enabling suppression of wrinkling due to moisture absorption. More preferably, the amount of the anionic polar functional groups in the anionic polymer is in a range of from 5 to 60 mass %, and still more preferably from 7 to 40 mass %.

The anionic polymer contained in the ablation layer is preferably a modified polyolefin resin, more preferably a copolymer of unsaturated conjugated carboxylic acid and an ethylenically unsaturated compound, still more preferably an ethylene-acrylic acid copolymer, even more preferably an ethylene-methacrylic acid copolymer, and still more preferably an ethylene-acrylic acid copolymer. In this case, the polar functional group of the anionic polymer is a carboxylic acid group.

As stated previously, in addition to any of the various anionic polymers described above, the ablation layer preferably contains a polymer having a saponification degree of not more than 90%, and having an ester bond in a side chain, within a range that can maintain wrinkling resistance.

The technique of using a polyvinyl alcohol as the ablation layer or as the protective film of an analog plate has heretofore been known. In this case, in order to prevent wrinkling due to rapid absorption of moisture, a low-water-solubility and high-crystallinity polyvinyl alcohol having a high degree of saponification has been generally used by persons skilled in the art.

As a result of extensive research without being bound by this practice, it was found that, when the ablation layer contains, in addition to the above-described anionic polymer, a polymer having a saponification degree of 0% or more and 90% or less, and having an ester bond in a side chain, the ablation layer can be prevented from wrinkling, and exhibits improved adhesion to the neighboring photosensitive resin composition layer or protective layer, thereby allowing peeling off or breakage to be effectively prevented.

The saponification degree of the polymer having a saponification degree of 0% or more and 90% or less, and having an ester bond in a side chain, is preferably 0% or more and 80% or less, more preferably not less than 0% or more and 75% or less, and still more preferably 0% or more and 70% or less.

As used herein, the term "saponification" generally refers to a reaction that involves the hydrolysis of an ester by an alkali to produce an alcohol and carboxylic acid, and the term "saponification degree" refers to a value obtained by subtracting the proportion of residual ester groups (mol %) from 100.

Examples of the polymer having the ester bond in the side chain may include, but are not limited to, polyvinyl acetate, partially saponified polyvinyl acetate (the saponified product is a polyvinyl alcohol), polyvinyl ester copolymers such as ethylene-vinyl acetate copolymer, and cellulose fatty acid ester compounds such as cellulose acetate.

The amount of the polymer having the saponification degree of not more than 90%, and having the ester bond in the side chain, based on 100 mass parts of the anionic polymer, is preferably 0.1 mass part or more and 500 mass parts or less, more preferably 0.5 mass part or more and 300 mass parts or less, and still more preferably 1 mass part or more and 100 mass parts or less, although not particularly limited thereto.

The thickness of the ablation layer is preferably 0.1 µm or more, in view of ensuring ultraviolet blocking properties during the below-described step of subjecting the photosensitive resin structure to exposure treatment.

On the other hand, if the thickness of the ablation layer exceeds 20 µm, the ablation properties will deteriorate; thus, the thickness is preferably from 0.1 to 20 µm, more preferably from 0.5 to 15 µm, and still more preferably from 1 to 10 µm.

The ablation layer preferably contains an infrared absorbent.

A simple substance or a compound having strong absorption properties at a wavelength of from 750 to 20,000 nm is typically used as the infrared adsorbent.

Examples thereof may include inorganic pigments such as carbon black, graphite, iron oxide, chrome oxide, and copper chromite; and dyes such as phthalocyanine and substituted phthalocyanine derivatives, cyanine dyes, merocyanine dyes, and polymethine dyes, and metal thiolate dyes.

Carbon black, in particular, is preferred because it can be used in a wide range of particle sizes, i.e., from 13 to 200 nm, and the infrared sensitivity increases as the particle size decreases.

The infrared absorbent is preferably added within a range that ensures a sensitivity such that the ablation layer can be removed by the laser beam used during the processing (drawing) of the ablation layer. Specifically, the infrared absorbent is preferably added in an amount of 10 to 80 mass %, based on the total mass amount of the ablation layer.

The ablation layer preferably contains a non-infrared blocking material.

Materials that reflect or absorb ultraviolet rays can be used as the non-infrared blocking material. Suitable examples thereof may include ultraviolet absorbents, carbon black, and graphite.

The amount of the non-infrared blocking material is preferably such that the optical density of the ablation layer is 2 or more, and more preferably 3 or more.

The optical density can be measured using the Densitometer D200-II (manufactured by Gretag Macbeth). The optical density is also the so-called visual sensation (ISO visual), and the light to be measured is that in the wavelength region of from about 400 to about 750 nm.

A material such as carbon black, which functions both as an infrared absorbent and a non-infrared blocking material, is particularly preferred.

Heretofore known additives, for example, a plasticizer, an antistatic agent, a release agent, an adhesion-adjusting agent, and the like may be optionally added to the ablation layer, within a range that does not impair its performance.

The ablation layer of the present embodiment can preferably be removed using an aqueous developer and/or a solvent-based developer.

The aqueous developer is a water-soluble washing liquid.

The aqueous developer typically contains a surfactant and an alkaline builder (a pH adjuster).

Examples of the surfactants may include anionic surfactants, amphoteric surfactants, and nonionic surfactants. The alkaline builder may be an organic or inorganic material, but is preferably adjustable to pH 9 or higher.

Further, in order to enhance the washing effect, the addition of a water-miscible organic solvent, for example, alkyl glycol ether, as a penetrant is also effective.

As the solvent-based developer, heretofore known materials can be used. Examples thereof may include esters such as heptyl acetate and 3-methoxy butyl acetate, hydrocarbons such as petroleum fractions, toluene, and decalin, and mixtures obtained by mixing chlorinated organic solvents such as tetrachloroethylene with alcohols such as propanol, butanol, and pentanol.

[Method for Forming an Ablation Layer]

The ablation layer of the present embodiment can be formed by, for example, applying a solution of a composition for forming the ablation layer containing the above-described anionic polymer to a predetermined film (a cover film constituting a photosensitive resin structure for a relief printing plate (typical thickness: 50 to 250 μm)) such that the thickness after drying is from 0.1 to 20 μm, followed by drying treatment.

Examples of the solvents for the solution of the composition for forming the ablation layer may include water, ethanol, isopropanol, ethoxyethanol, toluene, ethyl acetate, and tetrahydrofuran.

To the solution of the composition for forming the ablation layer, various surfactants, a defoaming agent, a leveling agent, a penetrant, and the like may be incorporated, in order to enhance the ease of application to the cover film.

Further, in order to ensure good peelability of the cover film when in use as the below-described photosensitive resin structure, the surface to be coated may be treated with a release agent in advance as a stage prior to applying the solution of the composition for forming the ablation layer.

[Photosensitive Resin Structure]

The photosensitive resin structure of the present embodiment has a support, a photosensitive resin composition layer provided on the support, and the above-described ablation layer provided on the photosensitive resin composition layer.

(Photosensitive Resin Composition Layer)

The photosensitive resin composition layer contains a photosensitive resin. Heretofore known materials are usable as the photosensitive resin.

For example, photosensitive resins proposed in Japanese Patent No. 3508788, Japanese Patent Application Publication No. 58-33884, Japanese Patent No. 2940006, and Japanese Patent No. 2985655 and the like are all usable.

The photosensitive resin composition is not particularly limited as long as it is cured by ultraviolet radiation, and its uncured portion is removable with a developer; generally, however, the photosensitive resin composition includes a photosensitive resin component, a polymerizable monomer component, a photopolymerization initiator, and a stabilizer.

The photosensitive resin component, in particular, greatly affects the physical properties of the intended final relief printing plate. Examples of usable photosensitive resins may include polyurethane resin systems, polyvinyl alcohol resin systems, polyester resin systems, nylon resin systems, and resin systems (binder polymers) obtained by mixing and dispersing polar group-containing polymers and hydrophobic polymers.

In particular, a resin system obtained by mixing and dispersing a polar group-containing polymer and a hydrophobic polymer is preferred, because it provides the intended relief printing plate with excellent durability, and forms a high-definition printing plate. Such a resin system is also useful in that it is highly versatile in the printing step.

Examples of polar group-containing polymers and hydrophobic polymers constituting the resin system obtained by mixing and dispersing a polar group-containing polymer and a hydrophobic polymer may include the following.

Examples of the polar group-containing polymers may include water-soluble or water-dispersible copolymers containing hydrophilic groups such as carboxyl, amino, hydroxyl, phosphoric acid, and sulfonic acid groups, or salts thereof.

Specific examples thereof may include the carboxyl group-containing NBR and carboxyl group-containing SBR described in Japanese Patent No. 2128098; copolymers of aliphatic conjugated dienes containing carboxyl groups described in, for example, Japanese Patent Laid-Open No. 5-7705, Japanese Patent Laid-Open No. 61-128243, Japanese Patent Laid-Open No. 6-194837, and Japanese Patent Laid-Open No. 7-134411; the emulsified polymers of ethylenically unsaturated compounds having phosphoric acid or carboxyl groups described in Japanese Patent Laid-Open No. 9-15860; the sulfonic acid group-containing polyurethane described in Japanese Patent Laid-Open No. 3-206456; and the carboxyl group-containing butadiene latex described in Japanese Patent Laid-Open No. 2002-162731. These polar group-containing polymers may be used alone or in a combination of two types or more.

Examples of the hydrophobic polymers may include polymers obtained by polymerization of conjugated diene hydrocarbons, and copolymers obtained by polymerization of conjugated diene hydrocarbons and mono-olefinic unsaturated compounds. Specific examples thereof may include butadiene polymers, isoprene polymers, chloroprene polymers, styrene-butadiene copolymer, styrene-butadiene-styrene copolymer, styrene-isoprene copolymer, styrene-isoprene-styrene copolymer, styrene-chloroprene copolymer, acrylonitrile-butadiene copolymer, acrylonitrile-isoprene copolymer, methyl methacrylate-butadiene copolymer, methyl methacrylate-isoprene copolymer, acrylonitrile-butadiene-styrene copolymer, and acrylonitrile-isoprene-styrene copolymer. These hydrophobic polymers may be used alone or in a combination of two types or more.

The polymerizable monomer is not particularly limited; examples thereof may include ester compounds of ethylenically unsaturated acids and alcohols, and the compounds described in, for example, "Hikari-koka Gijutsu Deta Bukku (Photocuring Technology Data Book) (published by TECHNO-NET)" can be applied.

Specific examples thereof may include straight, branched, and cyclic monofunctional monomers such as hexyl(meth) acrylate, nonane(meth)acrylate, lauryl(meth)acrylate, stearyl (meth)acrylate, 2-ethyl, 2-butylpropanediol(meth)acrylate, hydroxyethyl(meth)acrylate, 2-(meth)acryloyloxyethyl-hexahydrophthalate, 2-(meth)acryloyloxyethylphthalate, (meth)acrylic acid dimers, ECH-modified allyl acrylate, benzyl acrylate, caprolactone(meth)acrylate, dicyclopentenyl (meth)acrylate, isobornyl(meth)acrylate, and cyclohexyl (meth)acrylate; and straight, branched, and cyclic polyfunctional monomers such as hexanediol di(meth)acrylate, nonanediol di(meth)acrylate, 2-ethyl, 2-butylpropane di(meth)acrylate, neopentyl glycol di(meth)acrylate, hydroxypivalic acid neopentyl glycol di(meth)acrylate, ECH-modified phthalic acid di(meth)acrylate, tricyclodecane di(meth)acrylate, trimethylolpropane tri(meth)acrylate, pentaerythritol tri(meth)acrylate, ECH-modified glycerol tri(meth)acrylate, trimethylolpropane benzoate(meth)acrylate, EO(PO)-modified trimethylolpropane tri(meth)acrylate, and dipentaerythritol hexa(meth)acrylate.

Further examples thereof may include esters of alcohols and fumaric acid, such as dioctyl fumarate; and N-substituted maleimide derivatives such as lauryl maleimide and cyclohexylmaleimide.

As the photopolymerization initiator, those described in, for example, "Hikari-koka Gijutsu Deta Bukku (Photocuring Technology Data Book) (published by TECHNO-NET)" and "Shigaisen-koka Shisutemu (UV Curing Systems) (published by Sogo Gijutsu Center)" are usable.

Specific examples thereof may include benzophenone, Michler's ketone, benzoin, benzoin methyl ether, benzoin ethyl ether, α-methylolbenzoin, α-methylolbenzoin methyl ether, benzyl methyl ketal, 1-hydroxy-cyclohexyl-phenyl ketone, benzophenone, acrylated benzophenone, o-benzoyl methyl benzoate, bisacylphosphine oxide, α-methoxybenzoin methyl ether, 2,2-dimethoxy-2-phenylacetophenone, 2,2-diethoxy-2-phenylacetophenone, 2-methyl-1-[4-methylthio]phenyl, 2-morpholinopropane-1-one, thioxanthone, benzyl, and anthraquinone. These photopolymerization initiators may be used alone or in a combination of two types or more.

Examples of the stabilizer may include phenols such as 2,6-di-t-butyl-p-cresol, hydroquinone, p-methoxyphenol, catechol, t-butylcatechol, and β-naphthol; and phenothiazine, pyridine, nitrobenzene, m-dinitrobenzene, chloranil, and thiazine dyes.

To the photosensitive resin composition layer, additives such as a plasticizer, a polymerization inhibitor, a dye, an ultraviolet absorbent, and an anti-ozone agent may be further incorporated as required.

Examples of the plasticizers may include liquid 1,2 (or 1,4)-polybutadiene, 1,2 (or 1,4)-polyisoprene, or terminal-modified products thereof; and hydrocarbon oils such as naphthene oil and paraffin oil.

Materials generally used for coloring are usable as dyes.

Examples of the ultraviolet absorbents may include benzotriazol-, triazine-, benzophenone-, and other types of ultraviolet absorbents.

Examples of the anti-ozone agents may include dibenzyl ether, dihydroquinoline-, diphenylamine-, phenylenediamine-, mercaptobenzimidazole-, and other types of antioxidants, and waxes.

(Protective Layers)

In the photosensitive resin structure of the present embodiment, a first protective layer may be provided between the above-described photosensitive resin composition layer and ablation layer. This provides the effect of protecting the surface of the photosensitive resin composition layer from which the upper surface has been removed, after processing (drawing) of the ablation layer.

A second protective layer may further be provided as an upper layer on the ablation layer.

Specifically, the second protective layer may be provided between the cover film and ablation layer. This provides the effect of preventing the ablation layer from rapidly absorbing moisture, and preventing damage and breakage of the ablation layer, after peeling off the cover film.

The first and second protective layers may be formed of the same material or different materials.

Examples of the materials forming the first and second protective layers may include acrylic resins, styrene resins, vinyl chloride resins, vinylidene chloride resins, polyolefin resins, polyamide resins, polyacetal resins, polycarbonate resins, polyester resins, polyphenylene sulfide resins, polysulfone resins, polyether ketone resins, polyimide resins, fluororesins, silicone resins, urethane resins, urea resins, melamine resins, guanamine resins, epoxy resins, phenolic resins, and cellulose resins. In view of preventing washing residue from remaining, materials that dissolve and disperse in the developer used (a water developer or solvent developer) are preferred.

The thickness of each of the first and second protective layers is preferably 0.1 µm or more in order to exhibit a practically sufficient protective function, and preferably 20 µm or less in view of image reproducibility.

The first protective layer is formed on the photosensitive resin composition layer, and the second protective layer is formed on the ablation layer, using solutions of the above-described compositions for forming protective layers, such that the thickness after drying is 0.1 to 20 µm, using a predetermined cover film (typical thickness: from 50 to 250 µm).

Specifically, the second protective layer is formed, as required, on a predetermined cover film, using a solution of the composition for forming the second protective layer, such that the thickness after drying is 0.1 to 20 µm; subsequently, the ablation layer is formed on the second protective layer, using a solution of the composition for forming the ablation layer, such that the thickness after drying is from 0.1 to 20 µm.

Further, the first protective layer is formed, as required, on the ablation layer, using a solution of the composition for forming the first protective layer, such that the thickness is from 0.1 to 20 µm.

The thus-obtained laminate of one to three layers on the predetermined cover film is laminated onto the photosensitive resin composition, thereby giving a photosensitive resin structure. However, the production method is not limited to this example.

Examples of the solvents for the solutions of the compositions for forming the first and second protective layers may include water, ethanol, isopropanol, ethoxyethanol, toluene, ethyl acetate, and tetrahydrofuran.

To each of the solutions of the compositions for forming the protective layers, various surfactants, a defoaming agent, a leveling agent, a penetrant, and the like may be incorporated in order to enhance the ease of application.

Further, in order to ensure good peelability when in use as a photosensitive resin plate, the surfaces to be coated may be treated with a release agent in advance as a stage prior to applying the solutions of the compositions for forming the protective layers.

Polyethylene, polypropylene, polystyrene, and other materials are usable for the cover film; however, a polyethylene terephthalate film (a PET film) is preferred in view of its dimensional stability, thermal resistance, and mechanical performance.

(Support: Base Film)

As a support (base film) constituting the photosensitive resin structure of the present embodiment, for example, a dimensionally stable polyester film to which an adhesive layer is laminated is usable.

An easily adhesive coating film may be laminated between the polyester film and the adhesive layer.

Examples of the usable adhesives may include the adhesives having the polyester structure and adhesives having the polyurethane structure described in Japanese Patent Laid-Open No. 2001-264959, and the active light-curable and thermally curable adhesives described in the specification of Japanese Patent No. 3830959.

The thickness of the photosensitive resin structure of the present embodiment may, for example, be from 0.5 to 10 mm, although not particularly limited thereto.

[Method for Producing a Photosensitive Resin Structure]

The photosensitive resin structure of the present embodiment can be produced by, for example, forming an ablation layer on a cover film, bringing the surface on which the ablation layer has been formed in intimate contact with the photosensitive resin composition layer that has been laminated to a support, and laminating them to each other.

Specifically, in the case of a digital plate referred to as the flexo CTP and a solid photosensitive resin composition, a photosensitive resin structure may, for example, be formed as follows: A film comprising a layer having the laser ablation function is brought into intimate contact with and laminated to a photosensitive resin composition layer laminated to a polyethylene terephthalate support (provided with an antihalation effect, as required), thereby forming a plate-shaped structure.

[Method for Producing a Relief Printing Plate]

The method for producing a relief printing plate of the present embodiment comprises the steps of irradiating a photosensitive resin structure for relief printing comprising a support, a photosensitive resin composition layer provided on the support, and an ablation layer provided on the photosensitive resin composition layer, with ultraviolet radiation from a support side of the photosensitive resin structure, i.e., from the surface side not having the photosensitive resin composition layer; drawing a pattern by irradiating the ablation layer with an infrared radiation; exposing the pattern by irradiating the photosensitive resin composition layer with an ultraviolet radiation; and removing the ablation layer and unexposed photosensitive resin composition layer with a developer.

Specifically, after drawing a pattern on the ablation layer using infrared radiation, the ultraviolet radiation is performed, exposing the pattern on the photosensitive resin composition layer. The development treatment is subsequently performed, washing away the ablation layer and unexposed photosensitive resin composition layer, thus forming a pattern.

Subsequently, post-exposure treatment is performed, as required, resulting in a plate (a relief printing plate) formed of a cured product of the photosensitive resin composition layer.

The surface of this plate may also be brought into contact with a liquid containing a silicon compound and/or a fluorine compound.

(Step of Ultraviolet Irradiation from the Support Side)

The step of ultraviolet irradiation from the support side can be performed using a conventional irradiation unit.

Ultraviolet radiation at wavelengths of from 150 to 500 nm is usable as the ultraviolet radiation; in particular, ultraviolet radiation at wavelengths of from 300 to 400 nm can be preferably used.

Examples of usable light sources may include a low-pressure mercury lamp, a high-pressure mercury lamp, an ultra-high-pressure mercury lamp, a metal halide lamp, a xenon lamp, a zirconium lamp, a carbon arc lamp, and an ultraviolet fluorescent lamp.

The step of ultraviolet irradiation may also be performed prior to or after the step of drawing a pattern on the ablation layer.

(Step of Drawing a Pattern by Irradiating the Ablation Layer with Infrared Radiation)

When the photosensitive resin structure has a cover film, the cover film is peeled off first.

The ablation layer is then irradiated with infrared radiation in a form of the pattern, forming a mask on the photosensitive resin layer.

Examples of preferred infrared lasers may include ND/YAG lasers (for example, 1064 nm) and diode lasers (for example, 830 nm).

Laser systems suitable for the CTP platemaking technology are commercially available; for example, a diode laser system CDI Spark (ESKO GRAPHICS) can be used.

This laser system may include a rotary cylindrical drum for holding a printing original plate, an IR laser irradiation device, and a layout computer, and image information is transmitted from the layout computer directly to the laser device.

(Step of Exposing the Pattern by Irradiating the Photosensitive Resin Composition Layer with Ultraviolet Radiation)

After the pattern has been drawn as described above, the photosensitive resin composition layer is irradiated with ultraviolet radiation on its entire surface through the mask.

This can be performed with the plate being attached to the laser cylinder; generally, however, the plate is removed from the laser device, and then irradiation is performed using a conventional irradiation unit.

The same irradiation unit as that used for the ultraviolet irradiation from the support side can be used.

(Step of Removing the Ablation Layer and Unexposed Photosensitive Resin Composition Layer with a Developer)

In this development step, a heretofore known method can be used.

Specific examples thereof may include a method in which, after the photosensitive resin structure has been exposed as described above, it is immersed in a developer (a washing liquid), and the unexposed portion is dissolved or scraped off with a brush or the like; and a method in which a washing liquid is applied to the plate surface with a spray or the like, and the unexposed portion is subsequently dissolved or scraped off with a brush or the like.

Among developers, any of heretofore known aqueous developers can be used as an aqueous developer.

The developer contains a surfactant as an active ingredient.

Examples of the surfactants may include anionic surfactants, amphoteric surfactants, and nonionic surfactants. These surfactants may be used alone or as a mixture of two types or more.

Examples of the anionic surfactants may include sulfate salts, higher alcohol sulfates, higher alkyl ether sulfate salts, olefin sulfates, alkylbenzene sulfonates, $\alpha$-olefin sulfonates, phosphates, and dithiophosphates.

Examples of the amphoteric surfactants may include amino acid amphoteric surfactants and betaine amphoteric surfactants.

Examples of the nonionic surfactants may include polyethylene glycol surfactants such as higher alcohol ethylene oxide adducts, alkylphenol ethylene oxide adducts, fatty acid ethylene oxide adducts, polyhydric alcohol fatty acid ester ethylene oxide adducts, higher alkylamine ethylene oxide adducts, fatty acid amide ethylene oxide adducts, and polypropylene glycol ethylene oxide adducts; and polyhydric alcohol surfactants such as glycerol fatty acid esters, pentaerythritol fatty acid esters, fatty acid esters of solbitol and sorbitan, alkyl esters of polyhydric alcohols, and fatty acid amides of alkanolamines.

In order to enhance cleanliness, and enhance the permeability of a silicon compound into the plate, it is an effective way to add to the developer a water-miscible organic solvent, for example, alkyl glycol ether, as a penetrant, in addition to the various surfactants described above.

The penetrant can be selected according to the composition of the photosensitive resin composition layer to be washed. Examples of the penetrants may include mono- or polyethylene glycol ether nonionic penetrants, such as dibutyl diglycol ether.

The developer may also contain a pH adjuster referred to as an alkaline builder as an additional component.

The alkaline builder may be an organic or inorganic material, but is preferably adjustable to pH 9 or higher. Examples of the alkaline the builders may include sodium hydroxide, sodium carbonate, sodium silicate, sodium metasilicate, and sodium succinate.

The amounts of the surfactant, penetrant, and alkaline builder contained in the developer are not particularly limited.

The amount of the surfactant is typically from 1 to 50 mass parts, and preferably from 3 to 20 mass parts, based on 100 mass parts of the developer.

The penetrant is typically used in an amount of not less than 0.2 mass part or more and 20 mass parts or less, and preferably 0.2 mass part or more and 10 mass parts or less, based on 100 mass parts of the developer.

The alkaline builder is typically used in an amount of from 0.1 to 10 mass parts based on 100 mass parts of the developer.

If the amounts of these components are smaller than the above ranges, problems such as an excessively long development time will arise; and amounts greater than the above ranges are not desirable in terms of costs.

Among developers, known solvent-based developers can similarly be used as a solvent-based developer.

Examples thereof may include esters such as heptyl acetate and 3-methoxybutyl acetate, hydrocarbons such as petroleum fractions, toluene and decalin, and mixtures obtained by mixing chlorinated organic solvents such as tetrachloroethylene with alcohols such as propanol, butanol, and pentanol.

It is particularly preferred to use a 3:1 mixture (weight ratio) of tetrachloroethylene and butanol, or a hydrocarbon, as a washing liquid.

EXAMPLES

The present invention will be described below, referring to specific examples and comparative examples; however, the invention is not limited to these examples.

[(1) Measurement Methods and Evaluation Methods Used in the Examples and Comparative Examples]

(a) Water Absorption of Anionic Polymers

A polymer to be measured was formed into a film having a thickness of 75 µm (x); the film was dried for 7 days or more at 40° C. and a humidity of 0.1% or less, and the weight of the film was measured; and the film was left standing for 7 days or more at 40° C. and a humidity of 80% and allowed to absorb moisture, and the weight of the film was measured (y).

Water absorption A (%) was determined in accordance with the following expression:

$$\text{Water absorption } A\ (\%) \text{ is } A = 100 \times (y-x)/x.$$

(b) Amounts of Anionic Functional Groups in the Anionic Polymers

The amounts of anionic functional groups were measured only for polymers for which the values were not indicated by the manufacturers.

The measurement method was as follows: using a nuclear magnetic resonance apparatus "Avance 600" (trade name) manufactured by Bruker Biospin, 13C (150 MHz, quantitative mode) was measured; the molar ratio was determined by calculation based on the number of carbons derived from the functional groups, and converted to mass %.

(c) Test for Resistance to Wrinkling Due to Moisture Absorption

The resistance to wrinkling due to moisture absorption was evaluated as the wrinkle resistance, using the following method.

Photosensitive resin structures for the making of relief printing plates that had been cut into a size of 10×15 cm were allowed to stand for 24 hours or more in an environment at 50° C. and a humidity of 1% or less. The photosensitive resin structures in their dried state were subsequently cooled to room temperature.

In Examples 1 to 6 and Comparative Examples 1 and 2, the humidity was subsequently maintained at 80% in an environment at 25° C. for up to 3 minutes, and the presence or absence of wrinkles was visually observed. Samples that were not wrinkled were evaluated as ○, and those that were wrinkled were evaluated as X.

On the other hand, in Comparative Examples 7 to 19 and Comparative Examples 3 and 4, samples that were not wrinkled after being allowed to stand for 3 minutes in an environment at a temperature of 25° C. and a humidity of 90% were evaluated as ◎; samples that were not wrinkled after being allowed to stand for 3 minutes in an environment at a temperature of 25° C. and a humidity of 80% were evaluated as ○; and samples that were wrinkled after being allowed to stand for 3 minutes in an environment at a temperature of 25° C. and a humidity of 80% were evaluated as X.

(d) Evaluation of the Infrared Processability of Ablation Layers

Using an ultraviolet exposure unit "JE-A2-SS" (manufactured by Nihon Denshi Seiki Co., Ltd., trade name), each photosensitive resin structure was exposed for 60 seconds from its support side.

Subsequently, the cover film, i.e., the upper layer on the ablation layer, was peeled off; the resulting photosensitive resin structure was mounted to the rotary drum of CDI Spark 4260 (manufactured by ESKO GRAPHIC, trade name), with its support side being in contact therewith; and a solid image (1×2 cm) and 1%, 2%, 3%, and 5% (133 lines/inch) (each 1×1 cm) halftone dots were drawn (resolution: 2540 dpi) onto the ablation layer at 18.2 W output and at a rotation speed of 200 rpm, using a fiber laser (wavelength: 1070 nm).

When the zero point was adjusted based on the photosensitive resin composition layer on the support before lamination of the ablation layer, the halftone-dot ratio of the solid portion after drawing (the ratio of the drawn area) was evaluated as follows: a halftone-dot ratio of 90% or more: ◎; a halftone-dot ratio of not less than 80% and less than 90%: ○; and a halftone-dot ratio less than these ranges: X.

The halftone-dot ratio was measured using the Densitometer D200-II (manufactured by Gretag Macbeth) in the mode 4.

(e) Evaluation of Cleanliness

Using an ultraviolet exposure unit "JE-A2-SS" (manufactured by Nihon Denshi Seiki Co., Ltd., trade name), each photosensitive resin structure was exposed for 60 seconds from its support side.

Infrared processing of the ablation layer was subsequently performed according to the section (d) above, and exposure was performed for 12 minutes using the exposure unit mentioned above (illuminance: 10 mW).

Next, washing was performed at 40° C. in a horizontal washing machine (manufactured by Robo Denshi), using an aqueous developer containing, as a surfactant, 5 mass parts of "LEOCOL SC-80" (Lion Corporation, trade name, HLB 12.7), which is a 5-mole ethylene oxide adduct of $C_{12\text{-}14}$ secondary alcohols, 1 mass part of dibutyldiethylene glycol as a penetrant, and 0.4 mass part of sodium carbonate. After a washing time of 1 minute, the removal condition of the ablation layer was observed, and then washing was further performed for 19 minutes, making a total time of 20 minutes.

Drying was subsequently performed at 60° C. for 15 minutes, and post-exposure treatment was performed using a chemical lamp and a germicidal lamp.

As a result of the washing process described above, samples from which the ablation layer was uniformly removed in the washing time of 1 minute were evaluated as ⊚; samples from which the ablation layer was removed in the general washing time (20 minutes) were evaluated as ○; and samples in which uneven portions remained, and from which the ablation layer was not uniformly removed were evaluated as X.

(f) Evaluation of the Re-Adhesion of Ablation Layer Residue to Plate Surfaces

After the development treatment in the step described in the section (e) above, samples in which 5 or more pieces of ablation layer residue (major axis: 100 μm or more) adhered per 10×10 cm area of the surface of the photosensitive resin layer on which the pattern was formed were evaluated as X; and samples in which the number of pieces of ablation layer residue adhered was less than 5 were evaluated as ○.

(g) Evaluation of Resin Adhesion

Resin adhesion was evaluated for samples of Examples 7 to 19 and Comparative Examples 3 and 4 described below.

First, from each photosensitive resin laminate that had been cut into 11×16 cm having an anti-adhesion film, the anti-adhesion film was removed; subsequently, a cover film having an ablation layer was laminated to the laminate such that the ablation layer was in intimate contact with the photosensitive resin composition layer.

The resulting laminate was subsequently placed on a hot plate heated to 100° C. such that the cover film was in contact with the heating surface, and heated for 2 minutes under a load of 2 kg.

The laminate was then cooled for 2 minutes (cooling water was circulated in a cooling press, and the laminate was placed on the press such that the cover film was in contact with the cooling surface, and cooled for 2 minutes under a load of 2 kg), thus preparing a photosensitive resin structure for evaluation.

Next, the cover film was peeled off from the photosensitive resin structure that had been cut into a size of 2.54×10 cm from the above-described 11×16 cm photosensitive resin structure for evaluation. Subsequently, an adhesive tape (Cellotape (registered trademark) CT-15 manufactured by Nichiban Co., Ltd., width: 15 mm) was attached to the ablation layer in two lines overlapping each other by about 5 mm. The adhesive tape was then peeled off in the direction in which the ablation layer and photosensitive resin composition layer were peeled off. Evaluation was then made based on the following criteria:

The photosensitive resin composition layer was broken: ⊚

The resin was not broken, but the tensile strength was 100 g/inch or more: ○

The resin was not broken, and the tensile strength was less than 100 g/inch: X

The tensile test was performed by peeling off the adhesive-tape side of the photosensitive resin composition layer in the direction of 180°, and measuring the tensile strength at a crosshead speed of 50 mm/min, using the Autograph AGS-100G (manufactured by Shimadzu Corporation).

(h) Measurement of the Saponification Degrees of Polymers Having an Ester Bond in a Side Chain The saponification degree of each polymer having an ester bond in a side chain was measured by the following method.

First, about 1 g of a sample was taken and precisely weighed into an Erlenmeyer flask to the scale of 1 mg.

To the flask were added 100 mL of water and three drops of a phenolphthalein solution (a solution prepared by dissolving 1 g of phenolphthalein in 90 mL of ethanol, and adjusted to 100 mL with water), and the sample was completely dissolved at 90° C. or more while heating and stirring.

After allowing the sample to cool to room temperature, 25.00 mL of a 0.5 mol/L sodium hydroxide solution was added with a burette, the contents were thoroughly mixed, and the mixture was subsequently maintained at room temperature for 2 hours or more.

With respect to polymers having an estimated saponification degree of less than 70%, in order to promote the saponification reaction, the contents after the addition of the sodium hydroxide solution were stirred at 60° C. for 1 hour or more, and the mixture was subsequently allowed to cool to room temperature and maintained for 2 hours.

Next, 15.00 mL of 0.5 mol/L sulfuric acid was added to the Erlenmeyer flask with a burette, and the contents were thoroughly mixed.

The resulting mixture was titrated using a 0.5 mol/L sodium hydroxide solution as a standard solution until it turned pale red.

As a blank test, the above-described procedure was performed without adding a sample.

Using the value obtained by the method described above, the saponification degree was determined according to the expressions shown below.

Table 1 below shows the amounts of samples actually used, determined saponification degrees, and the like.

$$X1=((M2/1000)\times(a-b)\times f\times D/(S\times P/100))\times 100 \quad (1)$$

$$X2=M1\times X1/(n\times M2-B\times X1) \quad (2)$$

$$H=100-X2 \quad (3)$$

X1: the amount (%) of acetic acid corresponding to residual acetic acid groups

X2: residual acetic acid groups (mol %)

H: the saponification degree (mol %)

a: the amount (mL) of the standard solution used b: the amount (mL) of the standard solution used in the blank test f: the factor of the standard solution D: the concentration of the standard solution S: the amount (g) of the sample taken P: the purity (%) of the sample (LW-200: 39.7%, A50-Z5N, 49.7%, others: 99.0%)

M1: the molecular weight per repeating unit of the fully saponified product

M2: the molecular weight of carboxylic acid produced by hydrolyzing the ester bond of the side chain n: the number of functional groups (hydroxyl groups) per repeating unit of the fully saponified product B: the numerical value obtained according to the following relational expression that holds between X1 and X2:

$$X1=(X2\times2\times n/(M3\times X2+M1\times(100-X2)))\times100 \quad (4)$$

M3: the molecular weight per repeating unit of the fully esterified product

The expression (4) above can be modified into the following expression:

$$X2=M1\times X1/(n\times M2-(M3-M1)/100\times X1) \quad (5)$$

Based on the expressions (2) and (5), B can be expressed by the following expression:

$$B=(M3-M1)/100$$

The factor f of the 0.5 mol/L sodium hydroxide solution used as a standard solution in the Examples was determined by the following method:

About 2.5 g of amidosulfuric acid (manufactured by Kanto Kagaku, purity: 99.9 mass %), which is a standard material for quantitative analysis, was precisely weighed into a 200 mL conical beaker to the scale of 0.1 mg, and dissolved by adding 25 mL of water; subsequently, three drops of a bromothymol blue solution were added as an indicator, and the mixture was titrated with the 0.5 mol/L sodium hydroxide solution. The end point was determined to be the point at which the color of the solution changed yellow to bluish green.

$$f=m/(0.048545\times V)\times(A/100)$$

m: the mass amount of the weighed sulfamic acid (2.5125 g)

A: the purity of the amidosulfuric acid (99.9 mass %)

V: the volume of the 0.5 mol/L sodium hydroxide solution required for titration (52.65 mL)

0.048545: the mass amount (g) of the amidosulfuric acid corresponding to 1 mL of the 0.5 mol/L sodium hydroxide solution The polymers having an ester bond in a side chain shown in Table 1 above are as follows:

GL-05: polyvinyl alcohol (manufactured by Nippon Synthetic Chemical Industry Co., Ltd., trade name)

KM-11: polyvinyl alcohol (manufactured by Nippon Synthetic Chemical Industry Co., Ltd., trade name)

KP-08R: polyvinyl alcohol (manufactured by Nippon Synthetic Chemical Industry Co., Ltd., trade name)

LW-200: polyvinyl alcohol aqueous solution (manufactured by Nippon Synthetic Chemical Industry Co., Ltd., trade name)

JMR-10L: polyvinyl alcohol (manufactured by Japan Vam & Poval Co., Ltd., trade name)

A50-Z5N: polyvinyl acetate ethanol solution (manufactured by Nippon Synthetic Chemical Industry Co., Ltd., trade name)

L-20: cellulose acetate (manufactured by Daicel Chemical Industries, Ltd., trade name)

[(2) Methods for Producing Laminates of Supports and Photosensitive Resin Composition Layers]

(2-1) Support (2-1-1) Support A

The condensation reaction of 624 g of neopentyl glycol, 93 g of ethylene glycol, 485 g of sebacic acid, and 382 g of isophthalic acid was performed for 6 hours in an air atmosphere at a reaction temperature of 180° C. and a reduced pressure of 10 mmHg.

Subsequently, 87 g of tolylene diisocyanate was added thereto and further reacted at 80° C. for 5 hours, giving a polyol.

The number average molecular weight of the thus-obtained polyol was measured by gel permeation chromatography, and determined to be about 32,000, using polystyrene standards.

The above polyol: 100 mass parts

2-Hydroxypropyl methacrylate: 2 mass parts

Tolylene diisocyanate (3 moles) adduct of trimethylolpropane (1 mole): 17 mass parts "VALIFAST YELLOW" (manufactured by Oriental Kasei, trade name): 5 mass parts Ethyl acetate: 300 mass parts These components were mixed to give a uniform solution.

TABLE 1

| Polymer having an ester bond in a side chain | GL-05 | KM-11 | KP-08R | LW-200 | JMR-10L | A50-Z5N | L-20 |
|---|---|---|---|---|---|---|---|
| a: Amount [mL] of the standard solution used | 11.0 | 14.2 | 15.7 | 21.7 | 23.9 | 29.4 | 25.2 |
| b: Amount [mL] of the standard solution used in the blank test | 5.75 | 5.75 | 5.75 | 5.75 | 5.75 | 5.75 | 5.75 |
| f: Factor of the standard solution | 0.982 | 0.982 | 0.982 | 0.982 | 0.982 | 0.982 | 0.982 |
| D: Concentration of the standard solution | 0.5 | 0.5 | 0.5 | 0.5 | 0.5 | 0.5 | 0.5 |
| S: Amount [g] of the sample taken | 1.020 | 1.062 | 1.022 | 2.515 | 1.001 | 2.014 | 1.072 |
| P: Purity [%] of the sample | 99.0 | 99.0 | 99.0 | 39.7 | 99.0 | 49.7 | 99.0 |
| M1: Molecular weight per repeating unit of the fully saponified product | 44.05 | 44.05 | 44.05 | 44.05 | 44.05 | 44.05 | 162.14 |
| M2: Molecular weight of the carboxylic acid | 60.05 | 60.05 | 60.05 | 60.05 | 60.05 | 60.05 | 60.05 |
| M3: Molecular weight per repeating unit of the fully esterified product | 86.09 | 86.09 | 86.09 | 86.09 | 86.09 | 86.09 | 288.25 |
| n: Number of functional groups (hydroxyl groups) per repeating unit of the fully saponified product | 1 | 1 | 1 | 1 | 1 | 1 | 3 |
| B: Coefficient for determining X2 | 0.4204 | 0.4204 | 0.4204 | 0.4204 | 0.4204 | 0.4204 | 1.2611 |
| X1: Amount [%] of acetic acid corresponding to residual acetic acid groups | 15.3 | 23.7 | 29.0 | 47.1 | 54.0 | 69.7 | 54.0 |
| X2: Residual acetic acid groups [mol %] | 12.6 | 20.8 | 26.7 | 51.5 | 63.7 | 99.8 | 78.2 |
| H: Saponification degree [%] | 87.4 | 79.2 | 73.3 | 48.5 | 36.3 | 0.2 | 21.8 |

Next, the solution was applied to a PET film "A4100" (manufactured by Toyobo Co., Ltd., trade name) having a thickness of 125 μm using a knife coater such that the amount of the coating after drying was 10 to 14 g/m².

The resulting material was dried at 80° C. for 2 minutes, and subsequently allowed to stand for 3 days in an atmosphere at 40° C., thereby giving a support A having an urethane adhesive layer.

(2-1-2) Support B

"TUFPRENE 912" (manufactured by Asahi Kasei Chemicals, trade name, styrene content: 40 mass %): 100 mass parts Tolylene diisocyanate (3 moles) adduct of trimethylolpropane (1 mole): 4 mass parts "VALIFAST YELLOW" (manufactured by Oriental Kasei, trade name): 5 mass parts Ethyl acetate: 262.5 mass parts Tetrahydrofuran: 262.5 mass parts Cellosolve acetate: 175 mass parts These components were mixed to give a uniform solution.

Next, the solution was applied to a PET film "A4100" (manufactured by Toyobo Co., Ltd., trade name) having a thickness of 125 μm using a knife coater such that the amount of the coating after drying was 10 to 14 g/m².

The resulting material was dried at 80° C. for 2 minutes, thereby giving a support B having an adhesive layer containing a thermoplastic elastomer.

(2-2) Photosensitive Resin Composition Layers

The photosensitive resin compositions described below were prepared as materials for forming the photosensitive resin composition layers.

(2-2-1) Photosensitive Resin Composition B-1

A pressure-resistant reaction vessel equipped with a stirrer and a temperature-adjusting jacket was initially charged with 125 mass parts of water, and 3 mass parts of an emulsifier "ADEKA REASOAP" (manufactured by Asahi Denka Kogyo, trade name), which is the ammonium salt of α-sulfo (1-nonylphenoxy)methyl-2-(2-propenyloxy)ethoxy-poly (oxy-1,2-ethanediyl).

The inside temperature of the pressure-resistant reaction vessel was elevated to a polymerization temperature of 80° C.; subsequently, an oily mixture containing 2 mass parts of acrylic acid, 5 mass parts of methacrylic acid, 60 mass parts of butadiene, 10 mass parts of styrene, 23 mass parts of butyl acrylate, and 2 mass parts of t-dodecyl mercaptan, and an aqueous solution containing 28 mass parts of water, 1.2 mass parts of sodium peroxodisulfurate, and 1 mass part of the ADEKA REASOAP emulsifier, were added at a fixed flow rate over 5 hours and 6 hours, respectively.

The resulting mixture was subsequently maintained for 1 hour to complete the polymerization, and then cooled, giving latex.

The thus-produced latex was adjusted to pH 7 with sodium hydroxide, and then unreacted product was removed by steam stripping, finally giving a hydrophilic polymer aqueous solution having a solids concentration of 40%.

The solution was dried at 60° C., giving a hydrophilic copolymer as a polymer component.

The obtained hydrophilic copolymer: 30 mass parts

Styren-butadiene-styrene block copolymer "KX-405" (manufactured by KRATON, trade name): 25 mass parts Liquid polybutadiene "LIR305" as a plasticizer (manufactured by Kuraray Co., Ltd., trade name, vinyl content: 8 mol %, viscosity at 30° C.: 40 Pa·s): 30 mass parts Hexamethylene dimethacrylate as polymerizable monomers: 2 mass parts 2-Butyl-2-ethylpropanediol diacrylate: 8 mass parts 2,2-Dimethoxy-2-phenylacetophenone as a photopolymerization initiator: 2 mass parts 2,6-Di-t-butyl-p-cresol as a polymerization inhibitor: 0.3 mass parts These materials were uniformly kneaded using a kneader at 130° C., giving a photosensitive resin composition B-1.

(2-2-2) Photosensitive Resin Composition B-2

Butadiene: 60 mass parts

Methyl acrylate: 9 mass parts

Phosphoric ethylene methacrylate: 20 mass parts

Styrene: 10 mass parts

Divinylbenzene: 1 mass part

Sodium dodecylbenzenesulfonate: 4 mass parts

Potassium persulfate: 0.3 mass part t-Dodecyl mercaptan: 0.4 mass part

Water: 200 mass parts

These components were mixed in a 10 liter volume autoclave, and polymerization was performed at 50° C.; once the polymerization conversion reached 95%, a terminating agent was added to terminate the reaction, and the reaction product was cooled with water to give an emulsion.

The emulsion was solidified by freezing, and the crumb was separated, washed with water, and vacuum-dried at 60° C. to give a hydrophilic copolymer as a polymer component.

The thus-obtained hydrophilic copolymer: 65 mass parts

Styrene-butadiene-styrene block copolymer "KT-65" (manufactured by Shell Chemicals, trade name "Califlex TR"): 35 mass parts Liquid polybutadiene "B-1000" as a plasticizer (manufactured by Nippon Soda, trade name "Nisso PB"): 50 mass parts 2,6-Di-t-butyl-p-cresol (BHT) as a polymerization inhibitor: 2 mass parts These materials were kneaded in a kneader at 150° C.; when they had been uniformly kneaded, 10 mass parts of 1,6-hexanediol diacrylate and 5 mass parts of 1,6-hexanedioldimethacrylate as polymerizable monomers, 1 mass part of benzoin methyl ether as a photopolymerization initiator, and 0.02 mass part of methylhydroquinone as a polymerization inhibitor were added and further kneaded, giving a photosensitive resin composition B-2.

(2-2-3) Photosensitive Resin Composition B-3

A solution prepared by dissolving 21.8 mass parts of hexamethylene di-isocyanate, 15.4 mass parts of dimethylol propionic acid, 7.6 mass parts of polytetramethylene glycol (PG-100 manufactured by Nippon Polyurethane Industry Co., Ltd.), and 1.0 mass part of di-n-butyltin dilaurate in 300 mass parts of tetrahydrofuran was placed in a 1 L flask equipped with a stirrer, and the flask was heated to 65° C. while stirring was continued, and the reaction was performed for 3 hours.

A solution prepared in a vessel different from the above 1 L flask by dissolving 55.3 mass parts of a terminal amino group-containing acrylonitrile-butadiene oligomer (Hycar ATBNX 1300×16 manufactured by Ube Industries, Ltd.) in 100 mass parts of methyl ethyl ketone was added to the above 1 L flask while stirring at room temperature, giving a polymer solution.

The obtained polymer solution was dried at a reduced pressure to remove the tetrahydrofuran and methyl ethyl ketone, giving a polymer having a number average molecular weight of 21,000.

Next, a solution prepared by dissolving 4.8 mass parts of lithium hydroxide in 100 mass parts of methyl alcohol was added to a solution prepared by dissolving 100 mass parts of the polymer obtained above in 100 mass parts of methyl ethyl ketone, while stirring at room temperature, and the mixture was further stirred for 30 minutes, thereby giving a hydrophilic copolymer as a polymer component.

10 mass parts of the hydrophilic copolymer obtained above; 45 mass parts of chlorinated polyethylene ("H-135" manufactured by Osaka Soda Co., Ltd.) and 15 mass parts of styrene-butadiene rubber ("SBR1507" manufactured by Japan Synthetic Rubber Co., Ltd.) as hydrophobic polymers; 28.5 mass parts of butadiene oligoacrylate ("PB-A" manufactured by Kyoeisha Yushi Co., Ltd.) as a polymerizable monomer; 1 mass part of benzyl dimethyl ketal ("Irgacure 651" manufactured by Ciba-Geigy Co., Ltd.) as a photopolymerization initiator; and 0.5 mass part of hydroquinone monomethyl ether as a polymerization inhibitor were dissolved and dispersed in 40 mass parts of toluene and 10 mass parts of water, and kneaded at 105° C. using a heating kneader, giving a photosensitive resin composition B-3.

(2-2-4) Photosensitive Resin Composition B-4

100 mass parts of water; 0.2 mass part of sodium dodecylbenzenesulfonate; 3 mass parts of polyoxyethylene nonylphenyl ether; 0.3 mass part of potassium persulfate; 0.2 mass part of t-dodecyl mercaptan; 29 mass parts of methyl methacrylate; 1 mass part of methacrylic acid; and 70 mass parts of butadiene were mixed and reacted at 50° C. for 20 hours, giving water-dispersed latex rubber (a) having a number average particle size of 140 nm, a glass transition temperature of −52° C., and a solids concentration of 50.5%.

65 mass parts of water; 1.3 mass parts of disproportionated potassium rosinate; 1.7 mass parts of potassium oleate; 1.5 mass parts of sodium alkylsulfonate; 0.05 mass part of t-dodecyl mercaptan; 0.1 mass part of paramenthane hydroperoxide; 0.003 mass part of iron sulfate; 0.006 mass part of sodium salt of ethylenediaminetetraacetic acid; 0.005 mass part of sodium formaldehyde sulfoxylate; 1.2 mass parts of potassium sulfate; and 100 mass parts of butadiene were used and reacted by low-temperature polymerization at a polymerization temperature of 5° C., giving a water-dispersed latex rubber (b) having a number average particle size of 350 nm and a solids concentration of 55%.

The polymerization conversion was about 60%.

First, 33.6 mass parts (17 mass parts as solids content) of the water-dispersed latex rubber (a); 14.5 mass parts (8 mass parts as solids content) of the water-dispersed latex rubber (b); 16 mass parts of phenoxypolyethylene glycol acrylate; and 14 mass parts of a polycondensation product of glycerol polyether polyol, succinic anhydride, and 2-hydroxyethyl acrylate were mixed in advance, and the moisture was evaporated in a dryer heated to 120° C. for 2 hours, giving a component (c).

Meanwhile, 20 mass parts of polybutadiene rubber ("Nipol" 1220L manufactured by Zeon Corporation) as a plasticizer, and 20 mass parts of nitrile rubber ("Nipol" 1042 manufactured by Zeon Corporation) as a hydrophobic polymer were kneaded for 10 minutes in a 200 mL volume laboratory kneader mill (manufactured by Toshin Co., Ltd.) heated to 140° C.

The component (c) prepared as described above was subsequently placed in the laboratory kneader mill, and the mixture was kneaded for 10 minutes.

Further, 1 mass part of benzyl dimethyl ketal as a photopolymerization initiator, 2 mass parts of dioctyl phthalate as a plasticizer, and 0.1 mass part of hydroquinone monomethyl ether as a polymerization inhibitor were placed in the kneader mill, and the mixture was kneaded for 5 minutes, giving a photosensitive resin composition B-4.

(2-3) Laminates of Supports and Photosensitive Resin Composition Layers (2-3-1) Laminate 1

The photosensitive resin composition of a plate-shaped photosensitive resin plate EF (manufactured by Asahi Kasei Chemicals, trade name: AWP) was placed between the support A and an anti-adhesion film (a PET film coated with a silicone release agent) using a heat press at 120° C., and then heat-pressed to be formed into a thickness of 1.14 mm, giving a laminate 1 of the support, photosensitive resin composition layer, and anti-adhesion film.

(2-3-2) Laminate 2

The photosensitive resin composition of a plate-shaped photosensitive resin plate SH (manufactured by Asahi Kasei Chemicals, trade name: AFP) was placed between the support B and an anti-adhesion film (a PET film coated with a silicone release agent) using a heat press at 120° C., and then heat-pressed to be formed into a thickness of 1.14 mm, giving a laminate 2 of the support, photosensitive resin composition layer, and anti-adhesion film.

(2-3-3) Laminate 3

The photosensitive resin composition (B-1) prepared as described above was placed between the support A and an anti-adhesion film (a PET film coated with a silicone release agent) using a heat press at 120° C., and then heat-pressed to be formed into a thickness of 1.14 mm, giving a laminate 3 of the support, photosensitive resin composition layer, and anti-adhesion film.

(2-3-4) Laminate 4

The photosensitive resin composition (B-2) prepared as described above was placed between the support A and an anti-adhesion film (a PET film coated with a silicone release agent) using a heat press at 120° C., and then heat-pressed to be formed into a thickness of 1.14 mm, giving a laminate 4 of the support, photosensitive resin composition layer, and anti-adhesion film.

(2-3-5) Laminate 5

The photosensitive resin composition (B-3) prepared as described above was placed between the support A and an anti-adhesion film (a PET film coated with a silicone release agent) using a heat press at 120° C., and then heat-pressed to be formed into a thickness of 1.14 mm, giving a laminate 5 of the support, photosensitive resin composition layer, and anti-adhesion film.

(2-3-6) Laminate 6

The photosensitive resin composition (B-4) prepared as described above was placed between the support A and an anti-adhesion film (a PET film coated with a silicone release agent) using a heat press at 120° C., and then heat-pressed to be formed into a thickness of 1.14 mm, giving a laminate 6 of the support, photosensitive resin composition layer, and anti-adhesion film.

Example 1

10 mass parts of an ethylene-acrylic acid copolymer "SG-2000" (manufactured by Namariichi Co., Ltd., trade name, a 20 mass % aqueous solution, water absorption: 1.2%, carboxylic acid content: 14 mass %), which is an anionic polymer having carboxylic acid groups as anionic polar functional groups; 5 mass parts of carbon black "BONJET CW-2" (manufactured by Orient Chemical Industries Co., Ltd., trade name, a 20 mass % aqueous solution); 0.05 mass part of a release agent "KF-351" (manufactured by Shin-Etsu Chemical Co., Ltd., trade name); 30 mass parts of water; and 15 mass parts of ethanol were mixed, giving a coating solution for forming an ablation layer.

The coating solution for forming the ablation layer was applied to a PET film having a thickness of about 100 μm for use as a cover film such that the thickness after drying was 3

µm, and then subjected to drying treatment at 90° C. for 2 minutes, thereby giving a laminate of the ablation layer and cover film.

The anti-adhesion film of the laminate 1 prepared in (2-3-1) above was subsequently peeled off.

The laminate 1 was then laminated to the laminate of the ablation layer and cover film obtained above such that the ablation layer was in contact with the photosensitive resin layer, giving a photosensitive resin structure for evaluation.

It is noted that, for use in the (c) evaluation of resistance to wrinkling due to moisture absorption, and (d) evaluation of infrared processability, photosensitive resin structures for evaluation were prepared by lamination at room temperature; and for use in the (e) evaluation of cleanliness and (f) evaluation of the re-adhesion of ablation layer residue to plate surfaces, photosensitive resin structures for evaluation were prepared by lamination at 150° C.

Table 2 below shows the results of the evaluations (c) to (f) for the thus-obtained photosensitive resin structures.

As is clear from Table 2, because the ablation layer of Example 1 contained an anionic polymer, it was not wrinkled by moisture absorption, had good infrared processability, was developable with an aqueous developer, and was substantially free of the re-adhesion of ablation layer residue. Thus, the ablation layer had extremely good evaluations for practical use.

Example 2

10 mass parts of an ethylene-acrylic acid copolymer "SG-2000" (manufactured by Namariichi Co., Ltd., trade name, a 20 mass % aqueous solution, water absorption: 1.2%, carboxylic acid content: 14 mass %), which is an anionic polymer; 5 mass parts of carbon black "BONJET CW-2" (manufactured by Orient Chemical Industries Co., Ltd., trade name, a 20 mass % aqueous solution); 0.5 mass part of Sumikaflex "900HL" (an ethylene-vinyl acetate copolymer, manufactured by Sumika Chemtex Co., Ltd., trade name); 0.1 mass part of a release agent "KF-351" (manufactured by Shin-Etsu Chemical Co., Ltd., trade name); 30 mass parts of water; and 15 mass parts of ethanol were mixed, giving a coating solution for forming an ablation layer.

The coating solution for forming the ablation layer was applied to a PET film having a thickness of about 100 µm for use as a cover film such that the thickness after drying was 3 µm, and then subjected to drying treatment, thereby giving a laminate of the ablation layer and cover film.

The thus-prepared laminate of the ablation layer and cover film was laminated to the laminate 1 prepared in (2-3-1) above, according to the same method as Example 1 above, thereby preparing a photosensitive resin structure for evaluation.

Table 2 below shows the results of the evaluations (c) to (f) for the thus-obtained photosensitive resin structures.

As is clear from Table 2 below, because the ablation layer of Example 2 contained an anionic polymer, it was not wrinkled by moisture absorption, had good infrared processability, was developable with an aqueous developer, and was substantially free of the re-adhesion of ablation layer residue. Thus, the ablation layer had extremely good evaluations for practical use.

Example 3

8 mass parts of an ethylene-acrylic acid copolymer "Nucrel N5130H" (manufactured by Dupont-Mitsui Polychemicals Co., Ltd., trade name, a 25 mass % aqueous solution, water absorption: 1.5%, carboxylic acid content: 20 mass % (values measured by the manufacturer)), which is an anionic polymer having carboxylic acid groups as anionic polar functional groups; 5 mass parts of carbon black "BONJET CW-2" (manufactured by Orient Chemical Industries Co., Ltd., trade name, a 20 mass % aqueous solution); 0.05 mass part of a release agent "KF-351" (manufactured by Shin-Etsu Chemical Co., Ltd., trade name); 30 mass parts of water; and 15 mass parts of ethanol were mixed, giving a coating solution for forming an ablation layer.

The coating solution for forming the ablation layer was applied to a PET film having a thickness of about 100 µm for use as a cover film such that the thickness after drying was 3 µm, and then subjected to drying treatment, thereby giving a laminate of the ablation layer and cover film.

The thus-prepared laminate of the ablation layer and cover film was laminated to the laminate 1 prepared in (2-3-1) above, according to the same method as Example 1 above, thereby preparing a photosensitive resin structure for evaluation.

Table 2 below shows the results of the evaluations (c) to (f) for the thus-obtained photosensitive resin structures.

As is clear from Table 2, because the ablation layer of Example 3 contained an anionic polymer, it was not wrinkled by moisture absorption, had good infrared processability, was developable with an aqueous developer, and was substantially free of the re-adhesion of ablation layer residue. Thus, the ablation layer had extremely good evaluations for practical use.

Example 4

8 mass parts of an ethylene-acrylic acid copolymer "SG-2000" (manufactured by Namariichi Co., Ltd., trade name, a 20 mass % aqueous solution, water absorption: 1.2%, carboxylic acid content: 14 mass %), which is an anionic polymer; 4 mass parts of polyvinyl alcohol "GL-05" (manufactured by Nippon Synthetic Chemical Industry Co., Ltd., trade name, saponification degree: 87.4%, viscosity: 4.8 to 5.8 mPa·s, a 10 mass % aqueous solution); 5 mass parts of carbon black "BONJET CW-2" (manufactured by Orient Chemical Industries Co., Ltd., trade name, a 20 mass % aqueous solution); 0.05 mass part of a release agent "KF-351" (manufactured by Shin-Etsu Chemical Co., Ltd., trade name); 30 mass parts of water; and 15 mass parts of ethanol were mixed, giving a coating solution for forming an ablation layer.

The coating solution for forming the ablation layer was applied to a PET film having a thickness of about 100 µm for use as a cover film such that the thickness after drying was 3 µm, and then subjected to drying treatment, thereby giving a laminate of the ablation layer and cover film.

The thus-prepared laminate of the ablation layer and cover film was laminated to the laminate 1 prepared in (2-3-1) above, according to the same method as Example 1 above, thus preparing a photosensitive resin structure for evaluation.

Table 2 below shows the results of the evaluations (c) to (f) for the thus-obtained photosensitive resin structures.

As is clear from Table 2, because the ablation layer of Example 4 contained an anionic polymer, it was not wrinkled by moisture absorption, had good infrared processability, was developable with an aqueous developer, and was substantially free of the re-adhesion of ablation layer residue. Thus, the ablation layer had extremely good evaluations for practical use.

Example 5

7 mass parts of an ethylene-methacrylic acid copolymer "Nucrel N2060" (manufactured by Dupont-Mitsui Polychemicals Co., Ltd., trade name, a 27 mass % aqueous solution, water absorption: 1.5%, carboxylic acid content: 20 mass % (values measured by the manufacturer)), which is an anionic polymer having carboxylic acid groups as anionic polar functional groups; 1 mass part of polyvinyl alcohol "GL-05" (manufactured by Nippon Synthetic Chemical Industry Co., Ltd., trade name, saponification degree: 87.4%, viscosity: 4.8 to 5.8 mPa·s, a 10 mass % aqueous solution); 5 mass parts of carbon black "BONJET CW-2" (manufactured by Orient Chemical Industries Co., Ltd., trade name, a 20 mass % aqueous solution); 0.05 mass part of a release agent "KF-351" (manufactured by Shin-Etsu Chemical Co., Ltd., trade name); 30 mass parts of water; and 15 mass parts of ethanol were mixed, giving a coating solution for forming an ablation layer.

The coating solution for forming the ablation layer was applied to a PET film having a thickness of about 100 for use as a cover film such that the thickness after drying was 3 μm, and then subjected to drying treatment, thereby giving a laminate of the ablation layer and cover film.

The thus-prepared laminate of the ablation layer and cover film was laminated to the laminate 1 prepared in (2-3-1) above, according to the same method as Example 1 above, thereby preparing a photosensitive resin structure for evaluation.

Table 2 below shows the results of the evaluations (c) to (f) for the thus-obtained photosensitive resin structures.

As is clear from Table 2, because the ablation layer of Example 5 contained an anionic polymer, it was not wrinkled by moisture absorption, had good infrared processability, was developable with an aqueous developer, and was substantially free of the re-adhesion of ablation layer residue. Thus, the ablation layer had extremely good evaluations for practical use.

Example 6

The anti-adhesion film of the laminate 2 prepared in (2-3-2) above was peeled off.

The laminate 2 was then laminated to a laminate of an ablation layer and a cover film obtained according to the same method as described in Example 2 such that the ablation layer was in contact with the photosensitive resin layer, giving a photosensitive resin structure for evaluation.

It is noted that, for use in the evaluation of resistance to wrinkling due to moisture absorption and the evaluation of active light processability, photosensitive resin structures for evaluation were prepared by lamination at room temperature; and for use in the evaluation of cleanliness, a photosensitive resin structure for evaluation was prepared by lamination at 150° C.

Table 2 below shows the results of the evaluations (c) to (f) for the thus-obtained photosensitive resin structures.

As is clear from Table 2, because the ablation layer of Example 6 contained an anionic polymer, it was not wrinkled by moisture absorption, had good infrared processability, was developable with a solvent-based developer, and was substantially free of the re-adhesion of ablation layer residue. Thus, the ablation layer had extremely good evaluations for practical use.

Comparative Example 1

20 mass parts of polyvinyl alcohol "GL-05" (manufactured by Nippon Synthetic Chemical Industry Co., Ltd., trade name, saponification degree: 87.4%, viscosity: 4.8 to 5.8 mPa·s (measurement method: JIS K6726), a 10 mass % aqueous solution); 5 mass parts of carbon black "BONJET CW-2" (manufactured by Orient Chemical Industries Co., Ltd., trade name, a 20 mass % aqueous solution); 0.05 mass part of a release agent "KF-351" (manufactured by Shin-Etsu Chemical Co., Ltd., trade name); 20 mass parts of water; and 15 mass parts of ethanol were mixed, giving a coating solution for forming an ablation layer.

The coating solution for forming the ablation layer was applied to a PET film having a thickness of about 100 μm for use as a cover film such that the thickness after drying was 3 μm, and then subjected to drying treatment, thereby giving a laminate of the ablation layer and cover film.

The thus-prepared laminate of the ablation layer and cover film was laminated to the laminate 1 prepared in (2-3-1) above, according to the same method as Example 1 above, thereby preparing a photosensitive resin structure for evaluation.

Table 2 below shows the results of the evaluations (c) to (f) for the thus-obtained photosensitive resin structures.

As is clear from Table 2, although the ablation layer in Comparative Example 1 ensured infrared processability, it was wrinkled by moisture absorption because the ablation layer used the polyvinyl alcohol instead of an anionic polymer. On the other hand, the ablation layer was developable with an aqueous developer, and substantially free of the re-adhesion of ablation layer residue, and, thus, had good evaluations in these respects.

Comparative Example 2

5 mass parts of a styrene-butadiene-styrene copolymer "TUFPRENE A" (manufactured by Asahi Kasei Chemicals Corporation, trade name, styrene content: 40 mass %) and 5 mass parts of carbon black "#30" (manufactured by Mitsui Chemicals, particle size: 30 nm) were kneaded in a kneader, and dissolved and dispersed in a mixed solution of toluene/ethyl acetate=1/9 to prepare a 5 mass % homogeneous solution, giving a coating solution for forming an ablation layer.

The coating solution for forming the ablation layer was applied to a PET film having a thickness of about 100 for use as a cover film such that the thickness after drying was 3 μm, and then subjected to drying treatment, thereby giving a laminate of the ablation layer and cover film.

The thus-prepared laminate of the ablation layer and cover film was laminated to the laminate 1 prepared in (2-3-1) above, according to the same method as Example 1 above, thereby preparing a photosensitive resin structure for evaluation.

Table 2 below shows the results of the evaluations (c) to (f) for the thus-obtained photosensitive resin structures.

As is clear from Table 2, the ablation layer of Comparative Example 2 was not wrinkled by moisture absorption, and ensured infrared processability. The ablation layer was also developable with an aqueous developer; however, re-adhesion of ablation layer residue to a plate surface could not be prevented because the ablation layer used the styrene-butadiene-styrene copolymer instead of an anionic polymer.

TABLE 2

| | Polymer in the ablation layer | Wrinkling | Infrared processability | Cleanliness | Re-adhesion of residue |
|---|---|---|---|---|---|
| Example 1 | Ethylene-acrylic acid copolymer "SG-2000" | ○ | ○ | ○ | ○ |
| Example 2 | Ethylene-acrylic acid copolymer "SG-2000" | ○ | ◎ | ○ | ○ |
| Example 3 | Ethylene-acrylic acid copolymer "Nucrel N5130H" | ○ | ◎ | ○ | ○ |
| Example 4 | Ethylene-acrylic acid copolymer "SG-2000"/PVA "GL-05" | ○ | ◎ | ○ | ○ |
| Example 5 | Ethylene-methacrylic acid copolymer "Nucrel N2060"/PVA "GL-05" | ○ | ◎ | ○ | ○ |
| Example 6 | Ethylene-acrylic acid copolymer "SG-2000" | ○ | ◎ | ○ | ○ |
| Comparative Example 1 | PVA "GL-05" | X | ◎ | ○ | ○ |
| Comparative Example 2 | SBS "TUFPRENE A" | ○ | ◎ | ○ | X |

Example 7

8 mass parts of an ethylene-acrylic acid copolymer "SG-2000" (manufactured by Namariichi Co., Ltd., trade name, a 20 mass % aqueous solution, water absorption: 1.2%, carboxylic acid content: 14 mass %), which is an anionic polymer; 8 mass parts of polyvinyl alcohol "GL-05" (manufactured by Nippon Synthetic Chemical Industry Co., Ltd., trade name, a 5 mass % aqueous solution having a saponification degree of 87.4% and a viscosity of 4.8 to 5.8 mPa·s) as a polymer having an ester bond in a side chain; 7.5 mass parts of carbon black "BONJET CW-2" (manufactured by Orient Chemical Industries Co., Ltd., trade name, a 20 mass % aqueous solution); 0.3 mass part of Sumikaflex "900HL" (an ethylene-vinyl acetate copolymer, manufactured by Sumika Chemtex Co., Ltd., trade name) as an adhesion-adjusting agent; 0.05 mass part of a release agent "KF-351" (manufactured by Shin-Etsu Chemical Co., Ltd., trade name); 20 mass parts of water; and 15 mass parts of ethanol were mixed, giving a coating solution for forming an ablation layer.

The thus-obtained coating solution for forming the ablation layer was applied to a PET film having a thickness of about 100 μm for use as a cover film such that the thickness after drying was 3 μm, and then subjected to drying treatment, thereby preparing the cover film on which the ablation layer was formed (a laminate of the cover film and ablation layer).

The support A prepared in (2-1-1) above, and the laminate 3 prepared in (2-3-3) above after the removal of the anti-adhesion film therefrom, were laminated to the laminate of the cover film and ablation layer obtained above such that the ablation layer was in contact with the photosensitive resin composition layer, thereby preparing a photosensitive resin structure for evaluation.

It is noted that, for use in the (c) evaluation of resistance to wrinkling due to moisture absorption, and (d) evaluation of infrared processability, photosensitive resin structures for evaluation were prepared by lamination at room temperature; and for use in the (e) evaluation of cleanliness and (f) evaluation of the re-adhesion of ablation layer residue to plate surfaces, photosensitive resin structures for evaluation were prepared by lamination at 150° C.

For use in the (g) evaluation of resin adhesion, a photosensitive resin structure for evaluation was prepared as follows.

From the photosensitive resin laminate that had been cut into 11×16 cm having an anti-adhesion film, the anti-adhesion film was removed; subsequently, the cover film having the ablation layer was laminated to the laminate such that the ablation layer was in intimate contact with the photosensitive resin. The resulting laminate was subsequently placed on a hot plate heated to 100° C. such that the cover film was in contact with the heating surface, and heated for 2 minutes under a load of 2 kg. The laminate was then cooled for 2 minutes (cooling water was circulated in a cooling press, and the laminate was placed on the press such that the cover film was in contact with the cooling surface, and cooled for 2 minutes under a load of 2 kg), thereby preparing a photosensitive resin structure for evaluation.

Table 3 below shows the results of the evaluations (c) to (g) for the thus-obtained photosensitive resin structures of Example 7.

Example 8

In the preparation of a coating solution for forming an ablation layer, 8 mass parts of a 5 mass % aqueous solution of polyvinyl alcohol "KM-11" (manufactured by Nippon Synthetic Chemical Industry Co., Ltd., trade name, saponification degree: 79.2%, viscosity: 11.7 to 14.3 mPa·s) was used as a polymer having an ester bond in a side chain instead of the 8 mass parts of the 5 mass % aqueous solution of polyvinyl alcohol "GL-05".

Otherwise, using the same conditions as described in [Example 7] above, photosensitive resin structures were prepared, and then evaluated.

Example 9

In the preparation of a coating solution for forming an ablation layer, 8 mass parts of a 5 mass % aqueous solution of polyvinyl alcohol "KP-08R" (manufactured by Nippon Synthetic Chemical Industry Co., Ltd., trade name, saponification degree: 73.3%, viscosity: 6 to 8 mPa·s) was used as a polymer having an ester bond in a side chain instead of the 8 mass parts of the 5 mass % aqueous solution of polyvinyl alcohol "GL-05".

Otherwise, using the same conditions as described in [Example 7] above, photosensitive resin structures were prepared, and then evaluated.

Example 10

In the preparation of a coating solution for forming an ablation layer, 1 mass part of a polyvinyl alcohol aqueous solution "LW-200" (manufactured by Nippon Synthetic Chemical Industry Co., Ltd., trade name, an aqueous solution having a saponification degree of 48.5%, a viscosity of 500 to 2,000 mPa·s, and a polymer concentration of 39.7 mass %) was used as a polymer having an ester bond in a side chain instead of the 5 mass % aqueous solution of polyvinyl alcohol "GL-05".

Otherwise, using the same conditions as described in [Example 7] above, photosensitive resin structures were prepared, and then evaluated.

Example 11

In the preparation of a coating solution for forming an ablation layer, 8 mass parts of a 5 mass % aqueous solution of polyvinyl alcohol "JMR-10L" (manufactured by Japan Vam & Poval Co., Ltd., trade name, saponification degree: 36.3%) was used as a polymer having an ester bond in a side chain instead of the 8 mass parts of the 5 mass % aqueous solution of polyvinyl alcohol "GL-05".

Otherwise, using the same conditions as described in [Example 7] above, photosensitive resin structures were prepared, and then evaluated.

Example 12

In the preparation of a coating solution for forming an ablation layer, Sumikaflex "900HL" (an ethylene-vinyl acetate copolymer, manufactured by Sumika Chemtex Co., Ltd., trade name), which is an adhesion-adjusting agent, was not added.

Otherwise, using the same conditions as described in [Example 8] above, photosensitive resin structures were prepared, and then evaluated.

Example 13

In the preparation of a coating solution for forming an ablation layer, 8.5 mass parts of an ethylene-acrylic acid copolymer "PRIMACOR 59901" (manufactured by Dow Chemical Japan Ltd., trade name, a 20 mass % aqueous solution, water absorption: 1.6%, carboxylic acid content: 20 mass %), which is an anionic polymer was used instead of the 8 mass parts of the ethylene-acrylic acid copolymer "SG-2000", which is an anionic polymer; and Sumikaflex "900HL", which is an adhesion-adjusting agent, was not added.

Otherwise, using the same conditions as described in [Example 9] above, photosensitive resin structures were prepared, and then evaluated.

Example 14

The laminate 4 was used as a laminate of a support, a photosensitive resin composition layer, and an anti-adhesion film.

Otherwise, using the same conditions as described in [Example 8] above, photosensitive resin structures were prepared, and then evaluated.

Example 15

The laminate 5 was used as a laminate of a support, a photosensitive resin composition layer, and an anti-adhesion film.

Otherwise, using the same conditions as described in [Example 8] above, photosensitive resin structures were prepared, and then evaluated.

Example 16

The laminate 6 was used as a laminate of a support, a photosensitive resin composition layer, and an anti-adhesion film.

Otherwise, using the same conditions as described in [Example 8] above, photosensitive resin structures were prepared, and then evaluated.

Example 17

2.6 mass parts of an addition condensation product (resol) of phenol-formaldehyde "PR-50607B" (manufactured by Sumitomo Bakelite Co., Ltd., trade name "SUMILITE RESIN", a 70 mass % aqueous solution, water absorption: 0%, phenolic hydroxyl group content: 14 mass %) as an anionic polymer having phenolic hydroxyl groups as anionic polar functional groups; 0.8 mass part of polyvinyl acetate "A50-Z5N" (manufactured by Nippon Synthetic Chemical Industry Co., Ltd., trade name "GOHSENYL", saponification degree: 0.2%, a 49.7 mass % ethanol solution) as a polymer having an ester bond in a side chain; 12 mass parts of carbon black "TB-8100 BLACK" (manufactured by Toyo Ink Mfg. Co., Ltd., trade name, a 12.5 mass % solution); 0.05 mass part of a release agent "KF-351" (manufactured by Shin-Etsu Chemical Co., Ltd., trade name); 15 mass parts of tetrahydrofuran; 7 mass parts of ethyl acetate; and 3 mass parts of cellosolve acetate were mixed, giving a coating solution for forming an ablation layer.

The thus-obtained coating solution for forming an ablation layer was applied to the release-treated surface of a release PET film "MRV100" (manufactured by Mitsubishi Plastics, Inc., trade name "DIAFOIL") having a thickness of about 100 μm for use as a cover film such that the thickness after drying was 3 μm, and then subjected to heat treatment at 100° C. for 3 minutes, thereby giving a laminate of an ablation layer and cover film.

Otherwise, using the same conditions as described in [Example 7] above, photosensitive resin structures were prepared, and then evaluated.

For measurement of the saponification degree of the polyvinyl acetate "A50-Z5N", in order to prepare a completely homogeneous solution, the following procedure was performed: about 2 g of a sample was taken and precisely weighed into an Erlenmeyer flask to the scale of 1 mg; subsequently, 25 mL of ethanol, 25 mL of water, 10 mL of tetrahydrofuran, and a phenolphthalein solution were added thereto, and the sample was completely dissolved while stirring; instead of performing the procedure in which about 1 g of a sample was taken and precisely weighed into an Erlenmeyer flask to the scale of 1 mg; subsequently, 100 mL of water and three drops of a phenolphthalein solution (a solution prepared by dissolving 1 g of phenolphthalein in 90 mL of ethanol, and adjusted to 100 mL with water) were added thereto, and the sample was completely dissolved at 90° C. or more while heating and stirring. Thereafter, the measurement was conducted as in the above-described method (h).

Example 18

0.4 mass part of cellulose acetate "L-20" (manufactured by Daicel Chemical Industries, Ltd., saponification degree: 21.8%) was used as a polymer having an ester bond in a side chain instead of the polyvinyl acetate "A50-Z5N".

Otherwise, using the same conditions as described in [Example 17] above, photosensitive resin structures were prepared, and then evaluated.

For measurement of the saponification degree of the cellulose acetate "L-20", in order to prepare a completely homogeneous solution, the following procedure was performed: about 1 g of a sample was taken and precisely weighed into an Erlenmeyer flask to the scale of 1 mg; subsequently, 50 mL of THF and three drops of a phenolphthalein solution were added thereto, and the sample was completely dissolved while stirring at room temperature; then, 25.00 mL of a 0.5 mol/L sodium hydroxide solution was added with a burette, 40 mL of water was further added thereto, and the contents were thoroughly stirred; subsequently, the mixture was maintained at room temperature for 2 hours or more; instead of performing the procedure in which about 1 g of a sample was taken and precisely weighed into an Erlenmeyer flask to the scale of 1 mg; subsequently, 100 mL of water and three drops of a phenolphthalein solution (a solution prepared by dissolving 1 g of phenolphthalein in 90 mL of ethanol, and adjusted to 100 mL with water) were added thereto, and the sample was completely dissolved at 90° C. or more while heating and stirring; after allowing the sample to cool to room temperature, 25.00 mL of a 0.5 mol/L sodium hydroxide solution was added with a burette, the contents were thoroughly mixed, and then the mixture was maintained at room temperature for 2 hours or more. Thereafter, the measurement was conducted as in the above-described method (h).

Example 19

12 mass parts of an isoprene-isoprene sulfonic acid copolymer "CS1201" (manufactured by JSR Corporation, trade name "DYNAFLOW", a 15 mass % aqueous solution, water absorption: 15%, sulfonic acid content: 23 mass %), which is an anionic polymer having sulfonic acid groups as anionic polar functional groups; 7.5 mass parts of carbon black "BONJET CW-2" (manufactured by Orient Chemical Industries Co., Ltd., trade name, a 20 mass % aqueous solution); 0.05 mass part of a release agent "KF-351" (manufactured by Shin-Etsu Chemical Co., Ltd., trade name); 20 mass parts of water; and 12 mass parts of ethanol were mixed, giving a coating solution for forming an ablation layer.

Otherwise, using the same conditions as described in [Example 7] above, photosensitive resin laminates were prepared, and then evaluated.

Comparative Example 3

5 mass parts of a styrene-butadiene-styrene copolymer "TUFPRENE A" (manufactured by Asahi Kasei Chemicals Corporation, trade name, styrene content: 40 mass %); and 5 mass parts of carbon black "#30" (manufactured by Mitsui Chemicals, particle size: 30 nm) were kneaded in a kneader, and dissolved and dispersed in a mixed solution of toluene/ethyl acetate=1/9 to prepare a 5 mass % homogeneous solution, giving a coating solution for forming an ablation layer.

The coating solution for forming the ablation layer obtained as described above was applied to a PET film having a thickness of about 100 μm for use as a cover film such that the thickness after drying was 3 μm, and then subjected to drying treatment, thereby preparing the cover film on which the ablation layer was formed, i.e., a laminate of the cover film and ablation layer.

The laminate of the cover film and ablation layer was laminated to the laminate 1 prepared in (2-3-1) above after the removal of the anti-adhesion film therefrom, such that the photosensitive resin layer was in contact with the ablation layer, thereby preparing a photosensitive resin structure for evaluation.

Comparative Example 4

20 mass parts of polyvinyl alcohol "GL-05" (manufactured by Nippon Synthetic Chemical Industry Co., Ltd., trade name, a 10 mass % aqueous solution having a saponification degree of 87.4% and a viscosity of 4.8 to 5.8 mPa·s) as a polymer having an ester bond in a side chain; 5 mass parts of carbon black "BONJET CW-2" (manufactured by Orient Chemical Industries Co., Ltd., trade name, a 20 mass % aqueous solution); 0.05 mass part of a release agent "KF-351" (manufactured by Shin-Etsu Chemical Co., Ltd., trade name); 20 mass parts of water; and 15 mass parts of ethanol were mixed, giving a coating solution for forming an ablation layer.

The thus-obtained coating solution for forming the ablation layer was applied to a PET film having a thickness of about 100 μm for use as a cover film such that the thickness after drying was 3 μm, and then subjected to drying treatment, thereby preparing the cover film on which the ablation layer was formed (a laminate of the cover film and ablation layer).

The laminate of the cover film and the ablation layer was laminated to the laminate 1 prepared in (2-3-1) above after the removal of the anti-adhesion film therefrom, such that the photosensitive resin layer was in contact with the ablation layer, thereby preparing a photosensitive resin structure for evaluation.

Each of the foregoing evaluations (c) to (g) was made for the thus-prepared photosensitive resin structures in Examples 7 to 19 and Comparative Examples 3 and 4. The evaluation results are shown in Table 3 below.

TABLE 3

| | | Ablation layer composition | | Evaluation results | | | | |
|---|---|---|---|---|---|---|---|---|
| | Photosensitive resin composition layer | Anionic polymer | Polymer having an ester bond in a side chain | Wrinkling | Infrared processability | Cleanliness | Re-adhesion of residue | Resin adhesion |
| Example 7 | B-1 | ○ SG-2000 | ○ GL-05 | ○ | ○ | ◎ | ○ | ○ |
| Example 8 | B-1 | ○ SG-2000 | ○ KM-11 | ○ | ◎ | ◎ | ○ | ◎ |
| Example 9 | B-1 | ○ SG-2000 | ○ KP-08R | ◎ | ◎ | ◎ | ○ | ◎ |
| Example 10 | B-1 | ○ SG-2000 | ○ LW-200 | ◎ | ◎ | ◎ | ○ | ◎ |

TABLE 3-continued

| | Ablation layer composition | | Polymer | Evaluation results | | | | |
|---|---|---|---|---|---|---|---|---|
| | Photosensitive resin composition layer | Anionic polymer | having an ester bond in a side chain | Wrinkling | Infrared processability | Cleanliness | Re-adhesion of residue | Resin adhesion |
| Example 11 | B-1 | ○ SG-2000 | ○ JMR-10L | ◎ | ◎ | ◎ | ○ | ◎ |
| Example 12 | B-1 | ○ SG-2000 | ○ KM-11 | ○ | ◎ | ◎ | ○ | ◎ |
| Example 13 | B-1 | ○ PRIMACOR 5990I | ○ KP-08R | ◎ | ◎ | ◎ | ○ | ◎ |
| Example 14 | B-2 | ○ SG-2000 | ○ KM-11 | ○ | ◎ | ◎ | ○ | ◎ |
| Example 15 | B-3 | ○ SG-2000 | ○ KM-11 | ○ | ◎ | ◎ | ○ | ◎ |
| Example 16 | B-4 | ○ SG-2000 | ○ KM-11 | ○ | ◎ | ◎ | ○ | ○ |
| Example 17 | B-1 | ○ PR-50607B | ○ A50-Z5N | ○ | ◎ | ○ | ○ | ◎ |
| Example 18 | B-1 | ○ PR-50607B | ○ L-20 | ○ | ◎ | ○ | ○ | ◎ |
| Example 19 | B-1 | ○ CS1201 | — | ◎ | ◎ | ◎ | ○ | ◎ |
| Comparative Example 3 | B-1 | X TUFPRENE A | — | ○ | ◎ | ○ | X | ◎ |
| Comparative Example 4 | B-1 | — | ○ GL-05 | X | ◎ | ◎ | ○ | X |

The marks shown in Table 3 indicate the following materials.

SG-2000: ethylene-acrylic acid copolymer
PRIMACOR 59901: ethylene-acrylic acid copolymer
PR-50607B: addition condensation product of phenol-formaldehyde
CS1201: isoprene-isoprene sulfonic acid copolymer
TUFPRENE A: styrene-butadiene-styrene block copolymer
GL-05: polyvinyl alcohol
(manufactured by Nippon Synthetic Chemical Industry Co., Ltd., saponification degree: 87.4%)
KM-11: polyvinyl alcohol
(manufactured by Nippon Synthetic Chemical Industry Co., Ltd., saponification degree: 79.2%)
KP-08R: polyvinyl alcohol
(manufactured by Nippon Synthetic Chemical Industry Co., Ltd., saponification degree: 73.3%)
LW-200: polyvinyl alcohol aqueous solution
(manufactured by Nippon Synthetic Chemical Industry Co., Ltd., an aqueous solution having a saponification degree of 48.5% and a polymer concentration of 39.6%)
JMR-10L: polyvinyl alcohol
(manufactured by Japan Vam & Poval Co., Ltd., saponification degree: 36.3%)
A50-Z5N: polyvinyl acetate
(manufactured by Nippon Synthetic Chemical Industry Co., Ltd., saponification degree: 0.2%, a 49.7 mass % ethanol solution)
L-20: cellulose acetate
(manufactured by Daicel Chemical Industries, Ltd., saponification degree: 21.8%)

As is clear from Table 3 above, because each of the ablation layers of Examples 7 to 19 contained an anionic polymer, and a polymer having an ester bond in a side chain, and having a saponification degree of 0% or more and 90% or less, these ablation layers were not wrinkled by moisture absorption, had practically sufficient high adhesion to the photosensitive resin composition layer, had good infrared processability, were developable with an aqueous developer, and were substantially free of the re-adhesion of ablation layer residue. Thus, these ablation layers had extremely good evaluations for practical use.

In contrast, the ablation layer of Comparative Example 3 was not wrinkled by moisture absorption, and ensured infrared processability. The ablation layer was also developable with an aqueous developer; however, re-adhesion of ablation layer residue to a plate surface could not be prevented because the ablation layer used a styrene-butadiene-styrene copolymer instead of an anionic polymer.

The ablation layer of Comparative Example 4 was wrinkled by moisture absorption and did not have sufficient resin adhesion, because it contained no anionic polymer.

The present application is based upon the Japanese patent application (Japanese Patent Application No. 2008-321945) filed with the Japan Patent Office on Dec. 18, 2008, and the Japanese patent application (Japanese Patent Application No. 2009-263241) filed with the Japan Patent Office on Nov. 18, 2009, the contents of which are incorporated herein by reference.

INDUSTRIAL APPLICABILITY

The ablation layer of the present invention is suitable for use in photosensitive resins for relief printing, and is industrially applicable in the fields of general commercial printing, such as films, labels, cartons, etc.

The invention claimed is:
1. An ablation layer for a photosensitive resin for a relief printing, the ablation layer capable of being processed by infrared radiation, and the ablation layer comprising:
an anionic polymer comprising at least one group selected form the group consisting of a phosphoric acid group, a sulfonic acid group, a carboxylic acid group, and a phenolic hydroxyl group, and a polymer having an ester bond in a side chain and having a saponification degree of from 0% to 80%, which is at least one of polyvinyl alcohol and polyvinyl acetate;

wherein the ablation layer can be removed with an aqueous developer.

2. The ablation layer according to claim 1, comprising a carbon black as an infrared absorbent.

3. A photosensitive resin structure for a relief printing comprising:

a support;

a photosensitive resin layer provided on the support; and the ablation layer according to claim 1 provided on the photosensitive resin layer.

4. A method for producing a relief printing plate comprising the steps of:

irradiating a photosensitive resin structure for a relief printing comprising a support, a photosensitive resin layer provided on the support, and the ablation layer according to claim 1 provided on the photosensitive resin layer, with an ultraviolet radiation from a support side of the photosensitive resin structure;

drawing a pattern by irradiating the ablation layer with an infrared radiation;

exposing the pattern by irradiating the photosensitive resin layer with an ultraviolet radiation; and removing the ablation layer and unexposed photosensitive resin layer with a developer.

\* \* \* \* \*